United States Patent
Lee et al.

(10) Patent No.: US 12,348,865 B2
(45) Date of Patent: Jul. 1, 2025

(54) ELECTRONIC DEVICE, AND METHOD FOR PERFORMING AUTOFOCUS BY ROTATING OR REORDERING AF DATA

(71) Applicant: Samsung Electronics Co., Ltd., Suwon-si (KR)

(72) Inventors: Changwoo Lee, Suwon-si (KR); Dohan Kim, Suwon-si (KR); Jinmin Bang, Suwon-si (KR); Jaehun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 398 days.

(21) Appl. No.: 17/873,468

(22) Filed: Jul. 26, 2022

(65) Prior Publication Data

US 2022/0359597 A1    Nov. 10, 2022

Related U.S. Application Data

(63) Continuation of application No. PCT/KR2021/001496, filed on Feb. 4, 2021.

(30) Foreign Application Priority Data

Feb. 4, 2020  (KR) .................. 10-2020-0013175

(51) Int. Cl.
*H04N 23/67* (2023.01)
*H04N 25/11* (2023.01)
(Continued)

(52) U.S. Cl.
CPC ......... *H04N 23/672* (2023.01); *H04N 25/704* (2023.01); *H10F 39/182* (2025.01); *H04N 25/11* (2023.01); *H10F 39/8063* (2025.01)

(58) Field of Classification Search
CPC ........ H01L 27/14627; H01L 27/14645; H04N 25/704; H04N 23/672; H04N 25/11; H04N 25/75

See application file for complete search history.

(56) References Cited

U.S. PATENT DOCUMENTS 8,036,521 B2   10/2011 Ono et al.
8,749,697 B2   6/2014 Sakaida
(Continued)

FOREIGN PATENT DOCUMENTS

CN    101750847 A    6/2010
CN    105247851 A    1/2016
(Continued)

OTHER PUBLICATIONS

Partial Supplementary European Search Report dated May 26, 2023, issued in European Patent Application No. 21751143.5.
(Continued)

*Primary Examiner* — Georgia Y Epps
*Assistant Examiner* — Erin R Garber
(74) *Attorney, Agent, or Firm* — Jefferson IP Law, LLP

(57) ABSTRACT

An electronic device is provided. The electronic device includes an image sensor including a plurality of pixels, an AP processing unit, a memory, and a control unit. Each pixel included in the plurality of pixels includes a plurality of photodiodes and a microlens. The control unit provides at least one of a first piece of AF data and a second piece of AF data to the AF processing unit, and the AF processing unit may execute a first phase autofocus (PAF) operation based on the first piece of AF data or execute a second PAF operation based on the second piece of AF data.

16 Claims, 17 Drawing Sheets

(51) Int. Cl.
  *H04N 25/704*    (2023.01)
  *H10F 39/00*     (2025.01)
  *H10F 39/18*     (2025.01)

(56) References Cited

U.S. PATENT DOCUMENTS

| | | | |
|---|---|---|---|
| 9,270,879 B2 | 2/2016 | Hamada | |
| 9,654,681 B2 | 5/2017 | Seo | |
| 9,787,889 B2 | 10/2017 | Johnson | |
| 9,794,472 B2 | 10/2017 | Aoki et al. | |
| 9,807,294 B2 | 10/2017 | Liu et al. | |
| 9,973,678 B2 | 5/2018 | Mandelli et al. | |
| 9,973,682 B2 | 5/2018 | Ham | |
| 10,015,389 B2 | 7/2018 | Lu et al. | |
| 10,075,639 B2 | 9/2018 | Jeong | |
| 10,387,477 B2 | 8/2019 | Galor Gluskin et al. | |
| 10,410,374 B2 | 9/2019 | Du et al. | |
| 10,440,301 B2 | 10/2019 | Li et al. | |
| 10,484,627 B2 | 11/2019 | Zhou | |
| 10,812,704 B2 | 10/2020 | Kikuchi et al. | |
| 10,999,544 B2 | 5/2021 | Wang et al. | |
| 11,017,250 B2 | 5/2021 | Turcot et al. | |
| 2010/0150538 A1 | 6/2010 | Ono et al. | |
| 2012/0194721 A1 | 8/2012 | Sakaida | |
| 2013/0188023 A1* | 7/2013 | Kuang | H04N 25/134 359/465 |
| 2014/0347537 A1 | 11/2014 | Hamada | |
| 2015/0156400 A1 | 6/2015 | Seo | |
| 2016/0205311 A1 | 7/2016 | Mandelli et al. | |
| 2016/0241772 A1 | 8/2016 | Johnson | |
| 2016/0344922 A1 | 11/2016 | Aoki et al. | |
| 2016/0344958 A1* | 11/2016 | Kondo | H04N 25/134 |
| 2017/0019584 A1 | 1/2017 | Ham | |
| 2017/0041525 A1 | 2/2017 | Liu et al. | |
| 2017/0359516 A1 | 12/2017 | Jeong | |
| 2018/0039156 A1 | 2/2018 | Moon et al. | |
| 2018/0084185 A1 | 3/2018 | Lu et al. | |
| 2018/0189581 A1 | 7/2018 | Turcot et al. | |
| 2018/0316878 A1 | 11/2018 | Zhou | |
| 2018/0349378 A1 | 12/2018 | Galor Gluskin et al. | |
| 2019/0082130 A1 | 3/2019 | Li et al. | |
| 2019/0116318 A1* | 4/2019 | Ogawa | H04N 23/635 |
| 2019/0206086 A1 | 7/2019 | Du et al. | |
| 2019/0281226 A1* | 9/2019 | Wang | H01L 27/14605 |
| 2020/0021744 A1 | 1/2020 | Kikuchi et al. | |
| 2020/0320661 A1* | 10/2020 | Lin | H04N 23/672 |

FOREIGN PATENT DOCUMENTS

| | | |
|---|---|---|
| CN | 105814877 A | 7/2016 |
| CN | 106030366 A | 10/2016 |
| CN | 106358026 A | 1/2017 |
| CN | 106449674 A | 2/2017 |
| CN | 109474771 A | 3/2019 |
| JP | 2012-155221 A | 8/2012 |
| KR | 10-2019-0042353 A | 4/2019 |
| KR | 10-2019-0089017 A | 7/2019 |
| KR | 10-2019-0106599 A | 9/2019 |

OTHER PUBLICATIONS

Chinese Office Action dated Aug. 28, 2024, issued in Chinese Patent Application No. 202180012317.5.

Extended European Search Report dated Aug. 29, 2023, issued in European Patent Application No. 21751143.5.

Chinese Notice of Allowance dated Dec. 27, 2024, issued in Chinese Application No. 202180012317.5.

Korean Office Action dated Mar. 17, 2025, issued in Korean Application No. 10-2020-0013175.

* cited by examiner

ELECTRONIC DEVICE, AND METHOD FOR PERFORMING AUTOFOCUS BY ROTATING OR REORDERING AF DATA

CROSS-REFERENCE TO RELATED APPLICATION(S)

This application is a continuation application, claiming priority under § 365(c), of an International application No. PCT/KR2021/001496, filed on Feb. 4, 2021, which is based on and claims the benefit of a Korean patent application number 10-2020-0013175, filed on Feb. 4, 2020, in the Korean Intellectual Property Office, the disclosure of which is incorporated by reference herein in its entirety.

BACKGROUND

1. Field

The disclosure relates to an electronic device for capturing an image and a method for performing auto focus (AF). More particularly, the disclosure relates to an electronic device for capturing an image by providing AF data in a plurality of directions using data obtained by a 4PD image sensor.

2. Description of Related Art

Various types of electronic devices (e.g., smartphones, tablet personal computers (PCs), and camera devices) capable of capturing images have come to the market. The electronic device may recognize an object to perform auto focus (AF).

A phase auto focus (PAF) scheme for detecting a phase difference between two pixels adjacent to each other and determining a focus is used as a method for performing auto focus (AF). The PAF scheme may be compared with a continuous AF scheme for measuring a focus depending on a change in planar frequency characteristics of an image to obtain more accurate and fast result in determining directionality of the focus.

In the PAF scheme, two-dimensional image pixels arranged consecutively and periodically on adjacent positions have a plurality of photo diodes (PDs) sharing one microlens. When PDs which are electrically separated from each other and optically have the same characteristic are not accurately focused, they may indicate different detection characteristics. The PAF scheme may analyze pieces of information among the plurality of PDs, which are detected when they are not focused, and may determine the consistency of AF.

The above information is presented as background information only to assist with an understanding of the disclosure. No determination has been made, and no assertion is made, as to whether any of the above might be applicable as prior art with regard to the disclosure.

SUMMARY

An image sensor of an electronic device according to the related art may perform AF by detecting a phase difference between 2PDs arranged in a horizontal direction. 2PDs separated horizontally may share one microlens and may be separated by a pixel wall. Lights incident through the microlens may be differently refracted along a path to be separated from each other. Because the image is formed horizontally by the same lens, when the focus is matched and there is a subject in an arrangement direction of pixels, characteristics and level values of pixels located horizontally may be varied. In this case, an edge separated in a vertical direction causes a problem incapable of detecting an ideal value irrespective of whether the focus is matched.

When using a 4PD image sensor including 4 (2×2) PDs separated in a horizontal direction and a vertical direction, an AF detection circuit performs calculation in the horizontal direction and calculation in the vertical direction at the same time, thus needing relatively many buffers therein to check a correlation between pixels adjacent to each other. Furthermore, the calculation process becomes complicated and there may occur a problem due to an increase in power consumption or cost.

Aspects of the disclosure are to address at least the above-mentioned problems and/or disadvantages and to provide at least the advantages described below. Accordingly, an aspect of the disclosure is to provide AF data in a plurality of directions using data obtained by a 4PD image sensor.

Additional aspects will be set forth in part in the description which follows and, in part, will be apparent from the description, or may be learned by practice of the presented embodiments.

In accordance with an aspect of the disclosure, an electronic device is provided. The electronic device includes an image sensor including a plurality of pixels, an AF processing unit that performs calculation for performing auto focus based on a phase difference, a memory, and configured to deliver data obtained by the image sensor to the AF processing unit or the memory. Each pixel included in the plurality of pixels includes a plurality of photo diodes and a microlens that covers the plurality of photo diodes. The configured to provide the AF processing unit with at least one of first AF data of photo diodes arranged in a first direction among the plurality of photo diodes or second AF data of photo diodes arranged in a second direction among the plurality of photo diodes. The AF processing unit may perform first phase auto focus (PAF) calculation based on the first AF data or may perform second PAF calculation based on the second AF data.

The electronic device according to embodiments disclosed in the disclosure may simultaneously or sequentially process AF data in a plurality of directions using data obtained by an image sensor.

The electronic device according to embodiments disclosed in the disclosure may detect directionality of an edge and may reorder AF data in an edge direction, thus simplifying calculation of an AF detection circuit.

The electronic device according to embodiments disclosed in the disclosure may reduce a calculation time and may enhance AF accuracy by means of rotation or reordering of the AF data of the image sensor.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
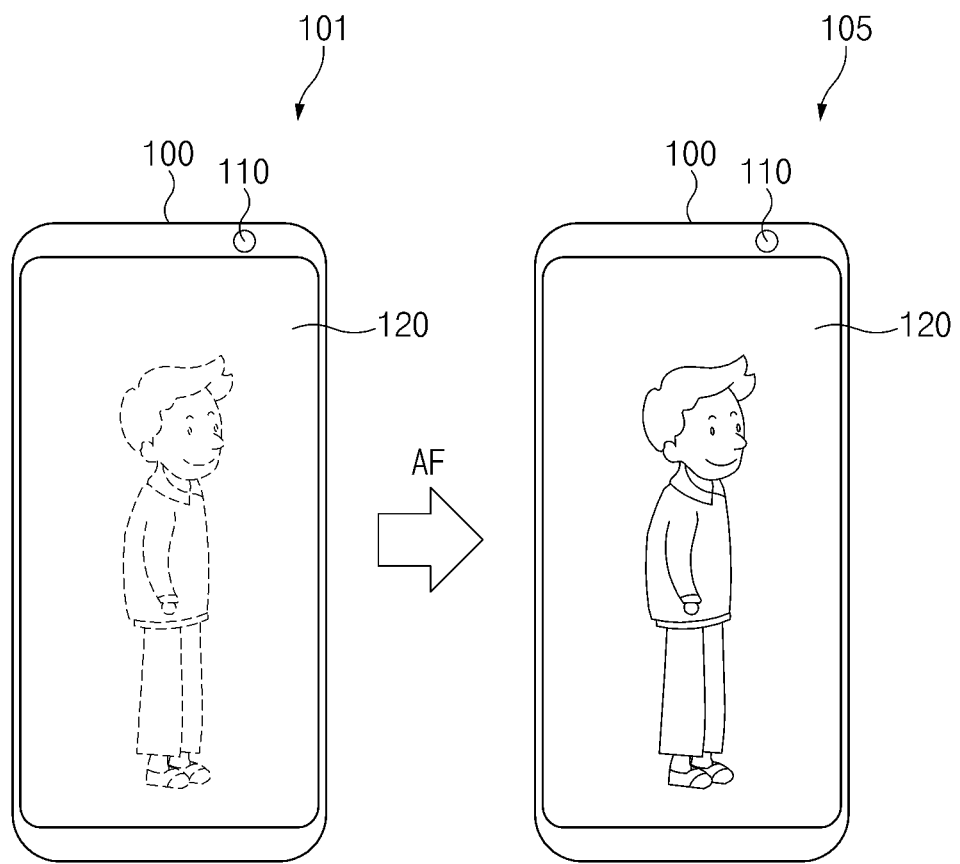
FIG. 1 illustrates an electronic device capable of capturing an image according to an embodiment of the disclosure.

FIG. 1 illustrates an electronic device capable of capturing an image according to an embodiment of the disclosure.

Referring to FIG. 1, an electronic device 100 according to an embodiment of the disclosure may generate a preview image based on image data obtained using a camera module (or a camera device) 110 and may output the generated preview image to a display 120.

The camera module 110 may include, for example, a lens assembly including one or more lens and an image sensor. Each pixel of the image sensor may include a plurality of photo diodes.

On a first screen 101, the electronic device 100 may generate phase difference data (or depth data) by optical path differences generated by the plurality of photo diodes (PDs) which share a microlens.

On a second screen 105, the electronic device 100 may adjust a focus on an external object by moving the one or more lenses included in the camera module 110, based on the generated phase difference data. Thus, the electronic device 100 may display a preview image focusing on the external object on the display 120.

It is illustratively shown that the camera module 110 is the front camera of the electronic device 100 in FIG. 1, but not limited thereto. For example, the camera module 110 may be disposed on at least one of a rear surface or a side surface of the electronic device 100.

Figure 2:
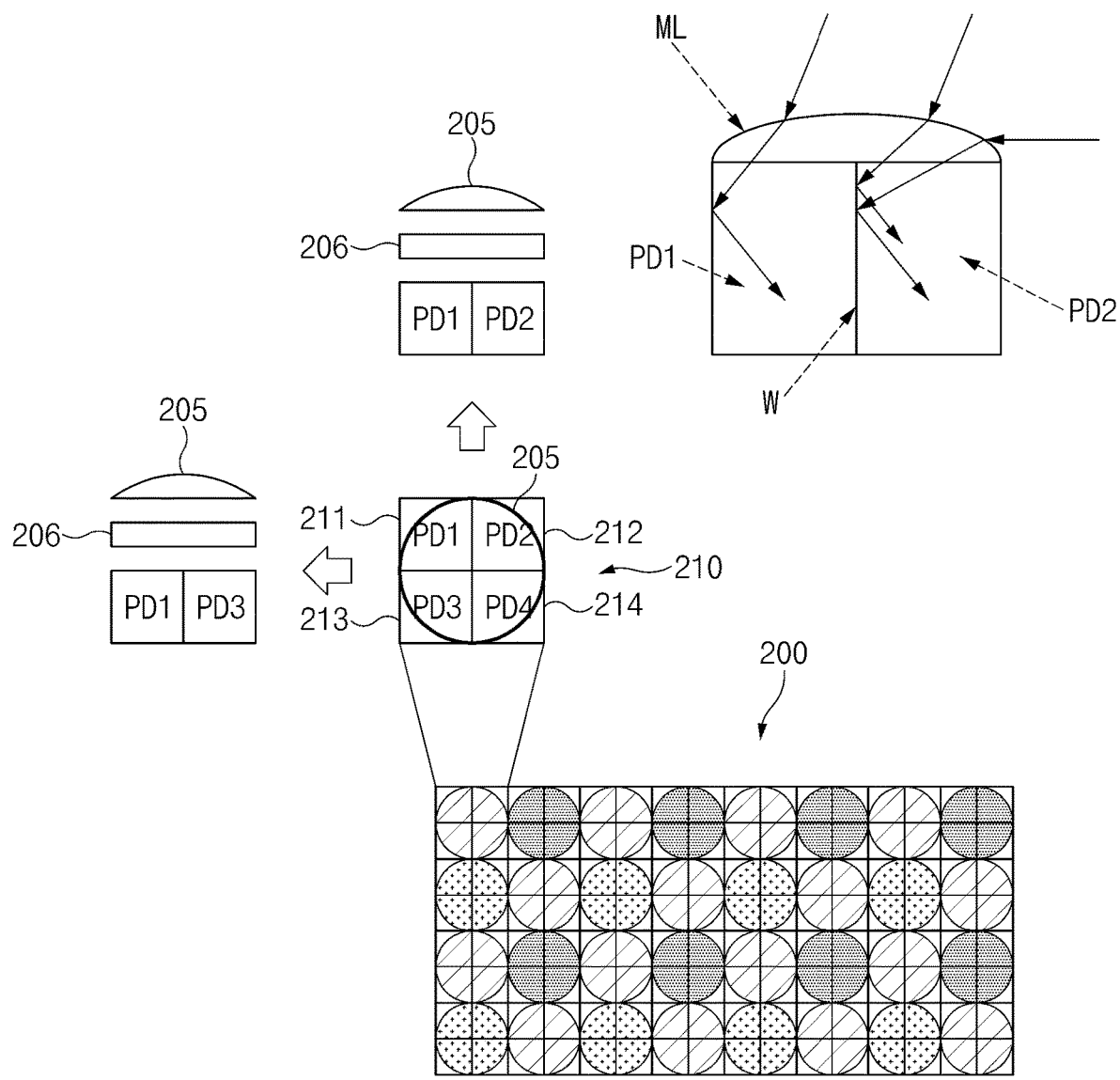
FIG. 2 illustrates a configuration of an image sensor according to an embodiment of the disclosure.

FIG. 2 illustrates a configuration of an image sensor according to an embodiment of the disclosure.

Referring to FIG. 2, an image sensor 200 included in a camera module (e.g., a camera module 110 of FIG. 1) may include a plurality of pixels. It is illustratively shown that the image sensor 200 outputs a Bayer-patterned image based on a signal generated by a 4PD image sensor in FIG. 2, but not limited thereto.

According to an embodiment of the disclosure, one 210 of a plurality of pixels may include a microlens 205, a color filter 206, a first PD (or a first sub-pixel) (PD1) 211, a second PD (or a second sub-pixel) (PD2) 212, a third PD (or a third sub-pixel) (PD3) 213, and a fourth PD (or a fourth sub-pixel) (PD4) 214.

The microlens 205 may cover the first to fourth PDs 211, 212, 213, and 214. The microlens 205 may adjust a path of an incident light such that a light incident from the outside may arrive at the first to fourth PDs 211, 212, 213, and 214.

The color filter 206 may be disposed between the microlens 205 and the first to fourth PDs 211, 212, 213, and 214 to pass a light of a specified wavelength range (e.g., a wavelength range corresponding to a green light). The color filter 206 may allow only the light of the specified wavelength range in the light passing through the microlens 205 and may limit a light except from the specified wavelength range.

Each of the first to fourth PDs 211, 212, 213, and 214 may convert the light passing through the microlens 205 and the color filter 206 into an electrical signal.

The light introduced from the outside may be refracted by the microlens 205 to be changed in progress path. The light passing through the microlens 205 may be directly introduced into the PD or may be reflected from a pixel wall W between the PDs to be introduced into the PD.

Figure 3:
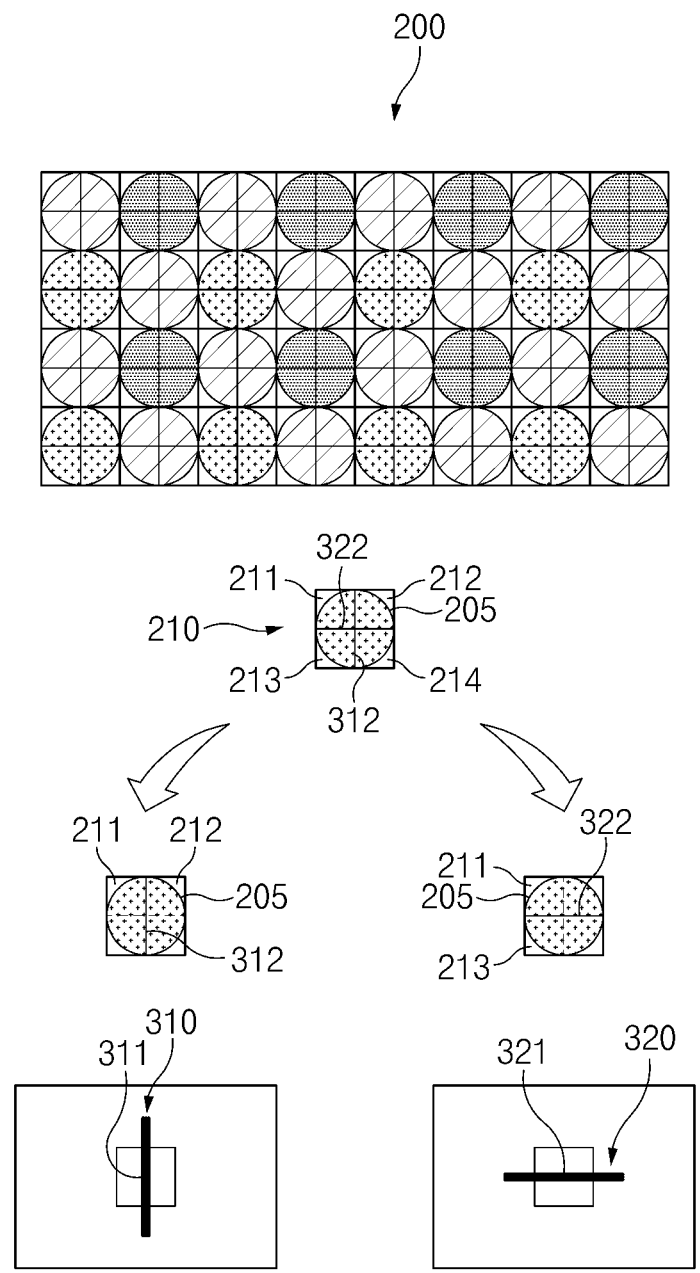
FIG. 3 is a drawing illustrating an edge direction and auto focus (AF) detection of an object according to an embodiment of the disclosure.

FIG. 3 is a drawing illustrating an edge direction and auto focus (AF) detection of an object according to an embodiment of the disclosure.

Referring to FIG. 3, an image sensor 200 may include a plurality of pixels. One 210 of the plurality of pixels may be covered by one microlens 205. For example, the one pixel 210 may include first to fourth PDs 211, 212, 213, and 214.

A first object 310 disposed in a vertical direction may form an edge 311 in a horizontal direction. The two pixels (e.g., the first PD 211 and the second PD 212) separated horizontally may be separated by a pixel wall 312. Lights incident through the microlens 205 may be differently refracted along a path to be separated from each other. Because the image is formed by the same microlens 205, characteristics and level values of pixels (e.g., the first PD 211 and the second PD 212) located horizontally may be varied for the first object 310 which has an identical focus and is present in an arrangement direction of pixels.

A second object 320 disposed in the horizontal direction may form an edge 321 in the vertical direction. The two pixels (e.g., the first PD 211 and the second PD 212) separated vertically may be separated by a pixel wall 322. Lights incident through the microlens 205 may be differently refracted along a path to be separated from each other. Because the image is formed by the same microlens, characteristics and level values of pixels (e.g., the first PD 211 and the third PD 213) located vertically may be varied for the second object 320 which has an identical focus and is present in an arrangement direction of pixels.

Figure 4:
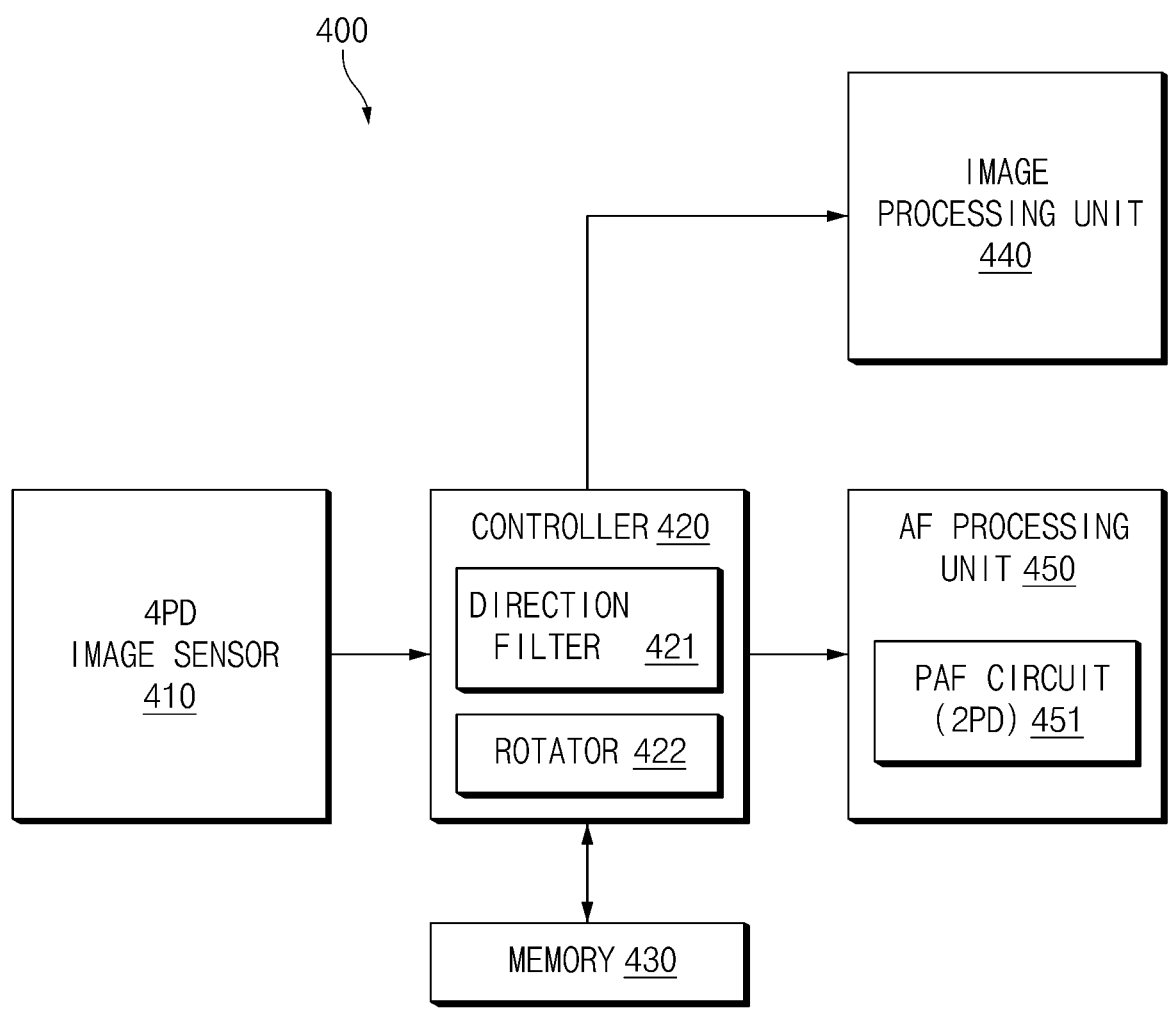
FIG. 4 illustrates a camera module according to an embodiment of the disclosure.

FIG. 4 illustrates a camera module according to an embodiment of the disclosure.

Referring to FIG. 4, a camera module 400 may include an image sensor 410, a controller 420, a memory 430, an image processing unit 440, and an AF processing unit 450. FIG. 4 is separated according to a function, but not limited thereto. For example, the image sensor 410 and the controller 420 may be integrated into one, or the controller 420 and the AF processing unit 450 may be integrated into one.

The image sensor 410 may convert a light incident from the outside into an electrical signal. The image sensor 410 may be composed of a plurality of pixels. Each pixel may include a plurality of PDs. Hereinafter, a description will be given of, but not limited to, the case where each pixel includes four PDs.

According to an embodiment of the disclosure, the image sensor 410 may generate image data for taking a picture or a moving image or image data for displaying a preview screen. Furthermore, the image sensor 410 may generate data (or a signal) (hereinafter, AF data) for performing AF.

According to an embodiment of the disclosure, when the image sensor 410 is composed of a plurality of PDs sharing the same one microlens, data of the plurality of PDs may be output in an arranged order (e.g., a Bayer pattern). According to another embodiment of the disclosure, the image sensor 410 may generate and output a signal of a format processed through an output mode, such as binning to reduce output data. The image sensor 410 may output a signal of a format processed by performing image processing in a horizontal/vertical direction or a diagonal direction depending on the arrangement of pixels and if necessary.

The controller (or a preprocessing unit or a data conversion unit) 420 may process image data or AF data received from the image sensor 410. The controller 420 may provide the image data to the image processing unit (e.g., an image signal processor (ISP)) 440. The controller 420 may temporarily store the AF data in the memory 430 or may deliver the AF data to the AF processing unit 450.

The controller 420 may detect directionality from the AF data of the image sensor 410 for accurate and simple AF calculation with respect to horizontal and vertical or more directions and may reorder data in a dominant direction, such that the AF processing unit 450 performs AF calculation.

For example, the controller 420 may maintain AF data in a first direction (e.g., a horizontal direction) and may rotate or reorder AF data in a second direction (e.g., a vertical direction) and may deliver the AF data to the AF processing unit 450. As a result, the AF processing unit 450 may consistently perform PAF calculation irrespective of directionality.

According to an embodiment of the disclosure, the controller 420 may convert and deliver the image data or the AF data, received from the image sensor 410, to the memory 430, the image processing unit 440, or the AF processing unit 450 or may deliver the image data or the AF data to the memory 430, the image processing unit 440, or the AF processing unit 450 without a separate conversion task.

According to various embodiments of the disclosure, the controller 420 may include a direction filter 421 or a rotator 422. The direction filter 421 may be used to determine a dominant direction among edge directions of an object. The rotator 422 may change the direction of the AF data to change the AF data in the form of data capable of being easily processed by the AF processing unit 450.

The memory 430 may store the AF data (or the converted AF data). For example, the memory 430 may be a dynamic random access memory (DRAM). The stored AF data may be delivered to the AF processing unit 450 depending on directionality of an edge.

The image processing unit (e.g., the ISP) 440 may process image data. For example, the received image data may be processed to be displayed as a preview image.

The AF processing unit 450 may perform AF (PAF) using a phase difference based on the received AF data. The AF processing unit 450 may include at least one or more PAF circuits 451. It is illustratively shown that the one PAF circuit is included in FIG. 4, but not limited thereto.

The PAF circuit 451 may perform PAF calculation in a specified direction. For example, the PAF circuit 451 may process AF data of some (e.g., two) of a plurality of photo diodes (e.g., first to fourth PDs) included in one pixel of the image sensor 410.

According to an embodiment of the disclosure, the PAF circuit 451 may perform PAF calculation using AF data extracted from pixels (e.g., the first PD and the second PD or the third PD and the fourth PD) separated horizontally or may perform PAF calculation using AF data extracted from pixels (e.g., the first PD and the third PD or the second PD and the fourth PD) separated vertically. Hereinafter, a description will be given of a 2PD PAF circuit, but not limited thereto.

According to an embodiment of the disclosure, the camera module 400 may include a plurality of PAF circuits respectively corresponding to a plurality of edge directions capable of being detected by the image sensor 410. For example, in case of edge detection in a vertical/horizontal direction, two PAF circuits may be included. For another example, when it is possible to detect edges in eight directions, eight PAF circuits may be included.

According to another embodiment of the disclosure, the camera module 400 may perform PAF calculation for the plurality of edge directions using one PAF circuit. For example, in case of the edge detection in the vertical/horizontal direction, PAF calculation of the edge in the horizontal direction may be primarily performed and PAF calculation of the edge in the vertical direction may be secondarily performed.

According to another embodiment of the disclosure, the camera module 400 may determine a dominant direction among directions of edges using one PAF circuit, perform PAF for one dominant direction, and may fail to, or subsidiarily, proceed with PAF for other directions.

According to various embodiments of the disclosure, at least some of the functions performed by the controller 420, the image processing unit 440, or the AF processing unit 450 may be performed by a processor (e.g., an AP) of an electronic device (e.g., an electronic device 100 of FIG. 1) including the camera module 400.

According to various embodiments of the disclosure, at least some of the controller 420, the image processing unit 440, or the AF processing unit 450 may be components (e.g., chips) separated in hardware. Alternatively, at least some of the controller 420, the image processing unit 440, or the AF processing unit 450 may be operations separated in software in the same calculation element.

Figure 5:
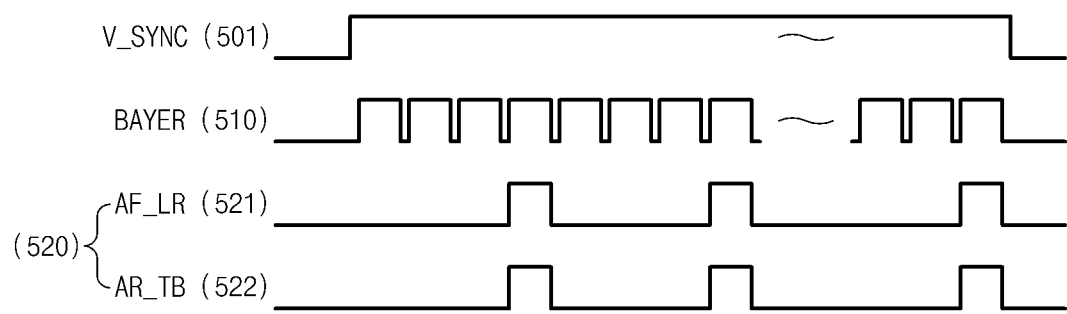
FIG. 5 is an output timing diagram of image data and AF data according to an embodiment of the disclosure.

FIG. 5 is an output timing diagram of image data and AF data according to an embodiment of the disclosure.

Referring to FIG. 5, when a state of an enable signal 501 of an image sensor 410 is changed, the image sensor 410 may output image data (e.g., a Bayer signal) 510. The image sensor 410 may output AF data 520 output at a longer time interval than the image data (e.g., the Bayer signal) 510, together with the image data (e.g., the Bayer signal) 510.

The image sensor 410 may process AF data in a direction to obtain AF from the image data (e.g., the Bayer signal) 510 and may output the AF data 520 with smaller resolution than the image data (e.g., the Bayer signal) 510 by means of binning or the like.

It is illustratively shown that the AF data AF_LR 521 in the horizontal direction and the AF data AF_transport blocks (TB) 522 in the vertical direction are output at the same timing in FIG. 5, but not limited thereto. For example, the AF data AF_LR 521 in the horizontal direction and the AF data AF_TB 522 in the vertical direction are output at different timings.

Figure 6:
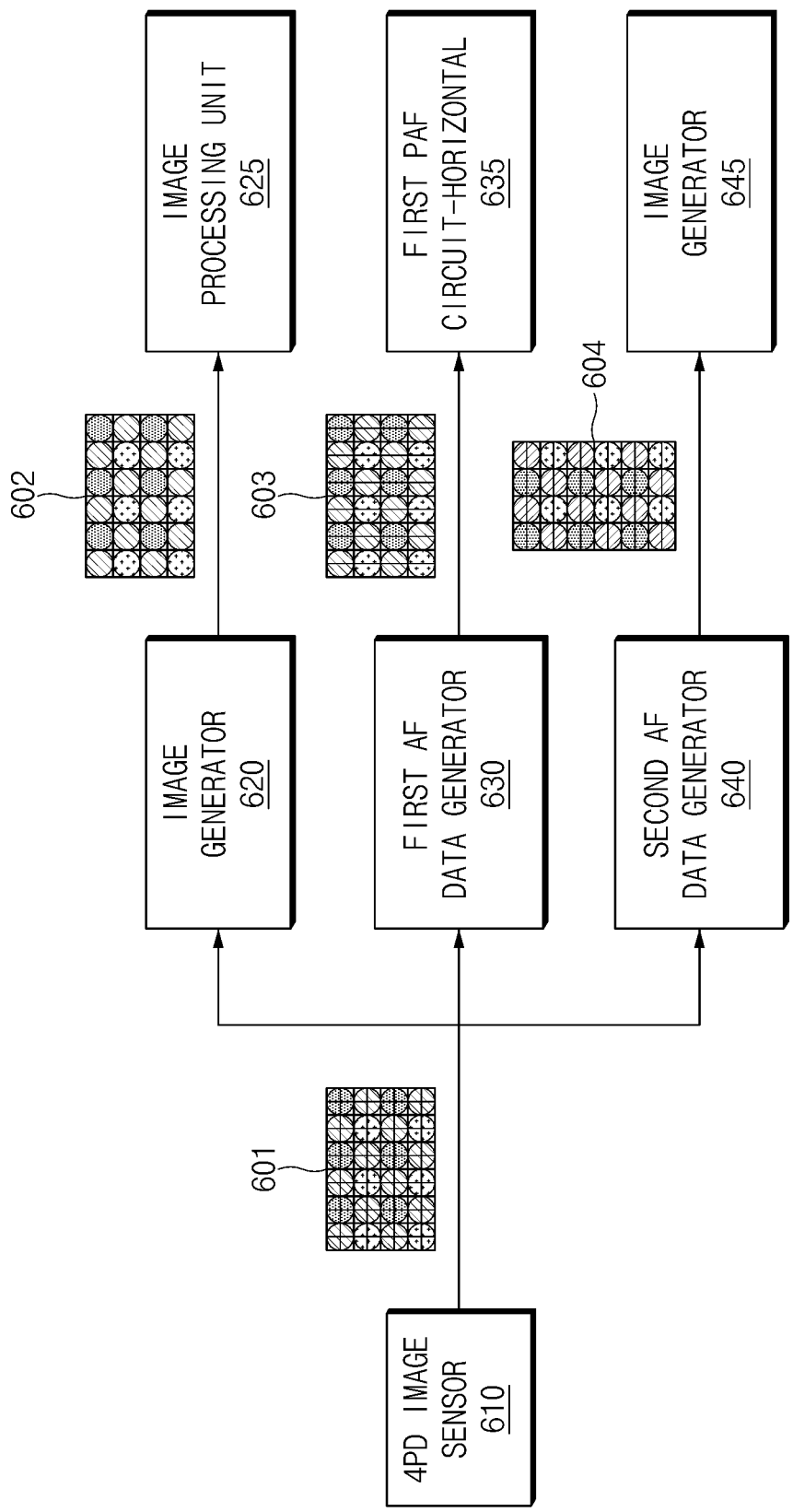
FIG. 6 illustrates AF processing using two 2 photo diodes phase auto focus (2PD PAF) circuits in a Bayer pattern according to an embodiment of the disclosure.

FIG. 6 illustrates AF processing using two 2 photo diodes phase auto focus (2PD PAF) circuits in a Bayer pattern according to an embodiment of the disclosure. Two 2PD PAF circuits are illustratively shown in FIG. 6, but not limited thereto.

Referring to FIG. 6, a 4PD image sensor 610 may include four PDs in one pixel. The 4PD image sensor 610 may sequentially read out PDs included in each pixel to generate a multi-PD signal (or raw data) 601.

An image generator 620 may integrate values of four PDs included in one pixel to generate image data 602. The image generator 620 may transmit the image data 602 to an image processing unit (e.g., an ISP) 625.

A first AF data generator 630 may deliver AF data 603 in a first direction (e.g., a horizontal direction) in the multi-PD signal 601 to a first PAF circuit 635.

A second AF data generator 640 may deliver AF data 604 in a second direction (e.g., a vertical direction) in the multi-PD signal 601 to a second PAF circuit 645.

Each of the first PAF circuit 635 and the second PAF circuit 645 may perform PAF calculation for a different direction. The first PAF circuit 635 and the second PAF circuit 645 may perform AF calculation at the same time. As a result, quick and accurate AF may be performed.

It is illustratively shown that the two PAF circuits are included in FIG. 6, but not limited thereto. For example, AF data for eight directions may be simultaneously and separately processed by eight PAF circuits.

Figure 7A:
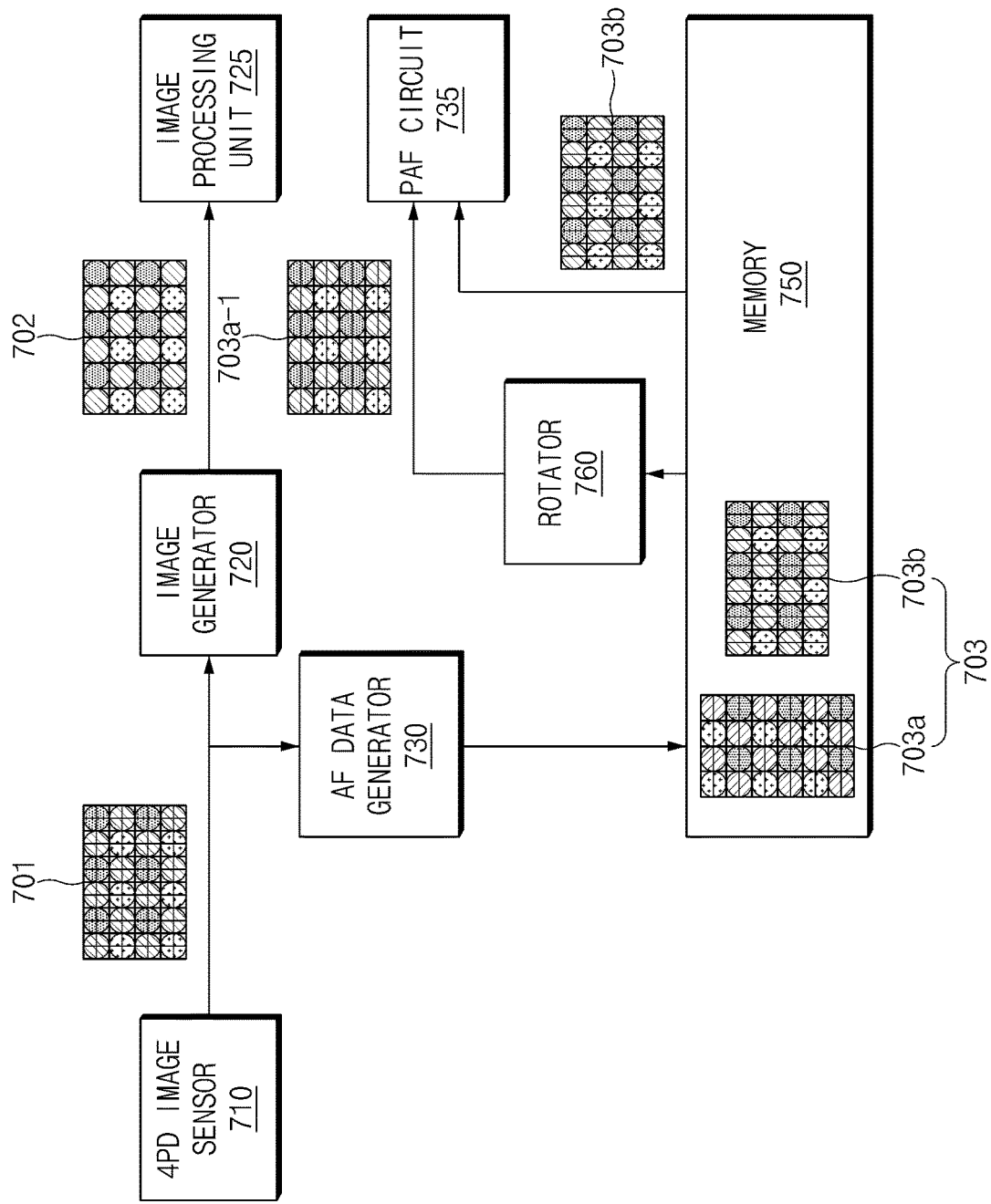
FIG. 7A illustrates AF processing using one 2PD PAF circuit in a Bayer pattern according to an embodiment of the disclosure.

FIG. 7A illustrates AF processing using one 2PD PAF circuit in a Bayer pattern according to an embodiment of the disclosure.

Referring to FIG. 7A, a 4PD image sensor 710 may include four PDs in one pixel. The 4PD image sensor 710 may sequentially read out PDs included in each pixel to generate a multi-PD signal (or raw data) 701.

An image generator 720 may integrate values of four PDs included in one pixel to generate main image data 702. The image generator 720 may transmit the image data 702 to an image processing unit (e.g., an ISP) 725.

An AF data generator 730 may convert the multi-PD signal 701 into AF data 703 capable of being processed by a PAF circuit 735 and may store the AF data 703 in a memory (e.g., a DRAM) 750. For example, vertical data 703*a* and horizontal data 703*b* may be stored.

The memory 750 may store the AF data 703. A memory 740 may be a memory buffer included in a camera module or a memory area formed independently of the camera module.

The PAF circuit 735 may process the AF data 703 stored for each direction from the memory 750. According to an embodiment of the disclosure, the PAF circuit 735 may sequentially process the AF data 703 depending on a direction. For example, the PAF circuit 735 may primarily process the horizontal data 703*b* and may secondarily process the vertical data 703*a*.

According to an embodiment of the disclosure, a rotator 760 may rotate and deliver signals in the other directions except for a first direction (e.g., a horizontal direction) to the PAF circuit 735.

For example, the vertical data 703*a* may rotate at 90 degrees to be provided to the PAF circuit 735 (703*a*-1). As a result, the horizontal data 703*b* and the converted vertical data 703*a*-1 may have a data structure similar to each other, and the calculation process of the PAF circuit 735 may be simplified.

Figure 7B:
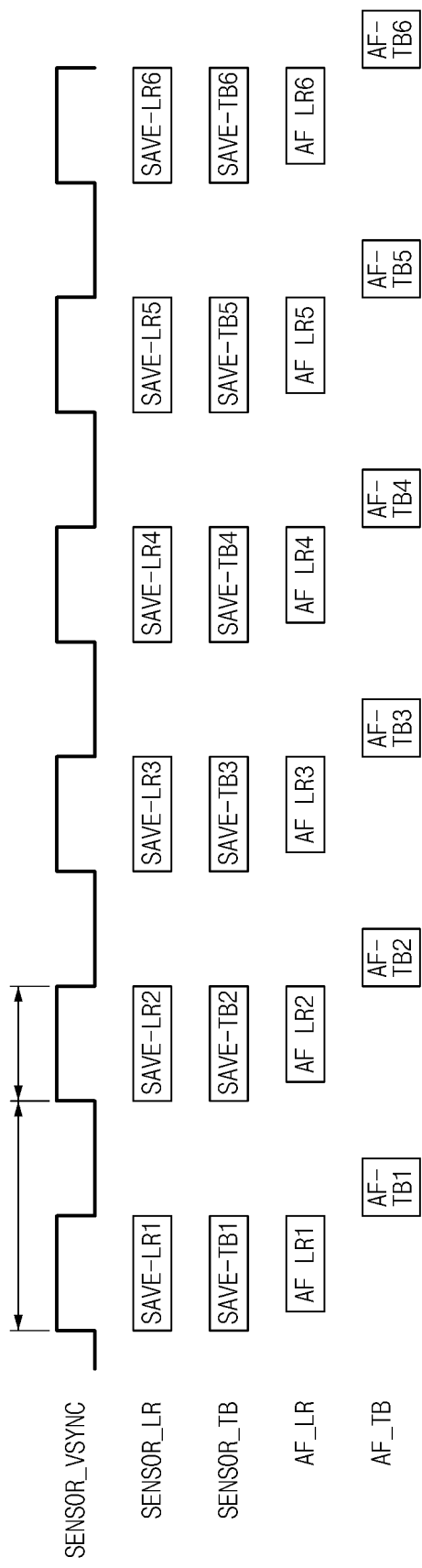
FIG. 7B is an output timing diagram of processing image data and AF data according to an embodiment of the disclosure.

FIG. 7B is an output timing diagram of processing image data and AF data according to an embodiment of the disclosure.

Referring to FIG. 7B, in response to a timing signal SENSOR_VSYNC of an image sensor 710, the image sensor 710 may store AF data SAVE_LR and SAVE_TB) at a specified time interval.

A PAF circuit 735 may start PAF using the horizontal data SAVE_LR at a time when the storage of the horizontal data SAVE_LR is completed. PAF (AF_LR) for a horizontal direction may be completed at the same time that the storage of the horizontal data SAVE_LR is ended (or as a portion of the storage of the horizontal data SAVE_LR is delayed).

After the PAF for the horizontal direction is completed, the PAF circuit 735 may start PAF (AF_TB) using the stored vertical data SAVE_TB. PAF using the vertical data SAVE_TB may proceed in a state where the vertical data SAVE_TB in stored (a state where a timing signal SENSOR_VSYNC is low).

AF data may be converted into a size smaller than image data to be output. It is possible to process PAF (AF_TB) within a relatively short time using the PAF (AF_LR) for the horizontal direction or the vertical data SAVE_TB. It may be possible to proceed with PAF (AF_TB), after the readout of all frames is completed because of having a different readout direction, using the vertical data SAVE_TB.

According to various embodiments of the disclosure, the PAF circuit 735 may perform PAF calculation for a plurality of directions in the state where the timing signal SENSOR_VSYNC is low. For example, the PAF circuit 735 may perform PAF calculation for the plurality of directions in a vertical direction, a 45-degree direction, and a 125-degree direction in the state where the timing signal SENSOR_VSYNC is low.

Figure 8A:
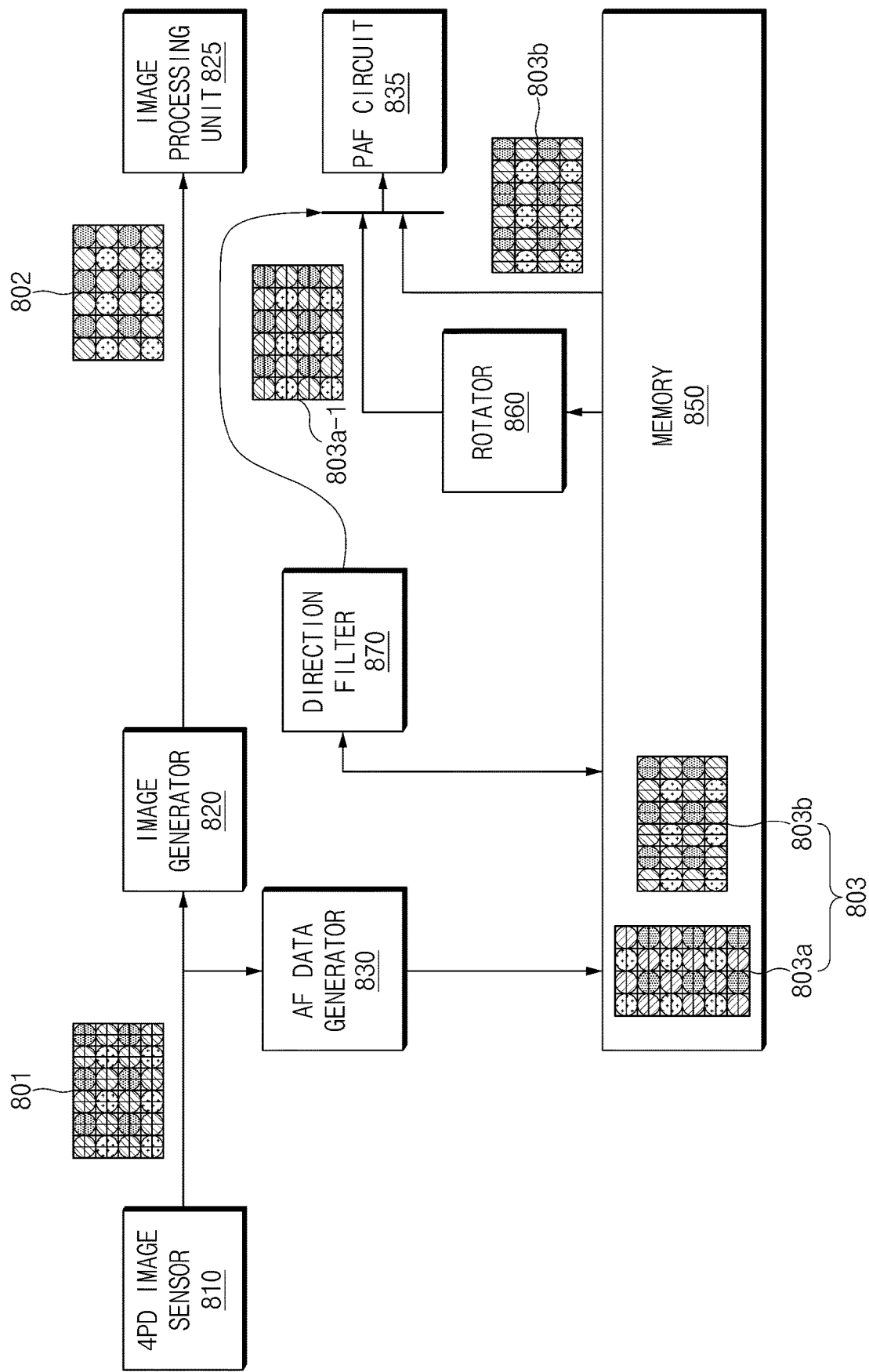
FIG. 8A illustrates AF processing using a direction filter in a Bayer pattern according to an embodiment of the disclosure.

FIG. 8A illustrates AF processing using a direction filter in a Bayer pattern according to an embodiment of the disclosure.

Referring to FIG. 8A, a 4PD image sensor 810 may include four PDs in one pixel. The 4PD image sensor 810 may sequentially read out PDs included in each pixel to generate a multi-PD signal (or raw data) 801.

An image generator 820 may integrate values of four PDs included in one pixel to generate main image data 802. The image generator 820 may transmit the image data 802 to an image processing unit (e.g., an ISP) 825.

An AF data generator 830 may convert the multi-PD signal 801 into AF data 803 capable of being processed by a PAF circuit 835 and may store the AF data 803 in a memory (e.g., a DRAM) 850. For example, vertical data 803*a* and horizontal data 803*b* may be stored.

The memory 850 may store the AF data 803. A memory 850 may be a memory buffer included in a camera module or a memory area formed independently of the camera module.

A direction filter 870 may detect an edge direction, using the AF data 803. The PAF circuit 835 may process AF data for one direction among the AF data 803 stored for each direction from the memory 850. The PAF circuit 835 may perform one PAF calculation for one direction determined by means of the direction filter 870.

For example, the vertical data 803*a* which is one direction according to an arrangement direction of an edge (or an arrangement direction of an object) may be selected between the horizontal data 803*a* and the vertical data 803*b*. The PAF circuit 835 may rotate the vertical data 803*a* by means of a rotator 860 (803*a*-1) to perform one PAF calculation.

According to an embodiment of the disclosure, the rotator 860 may rotate and deliver signals in the other directions except for a first direction (e.g., a horizontal direction) to the PAF circuit 835. For example, the vertical data 803*a* may rotate at 90 degrees to be delivered to the PAF circuit 835 (803*a*-1). As a result, the horizontal data 803*b* and the converted vertical data 803*a*-1 may have a data structure similar to each other, and the calculation process of the PAF circuit 835 may be simplified.

Figure 8B:
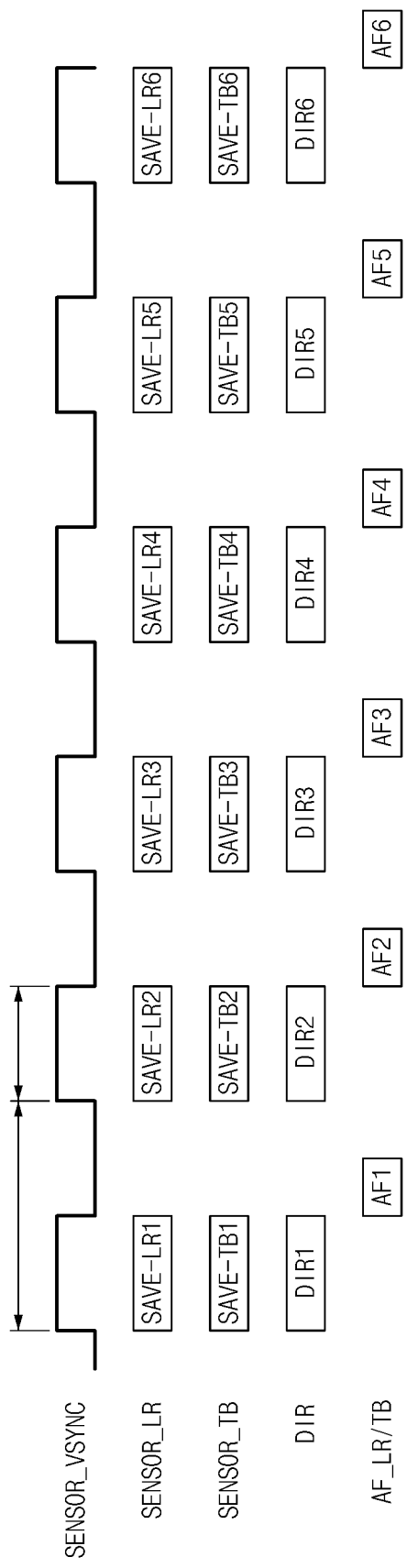
FIG. 8B is an output timing diagram of selective AF processing using a direction filter according to an embodiment of the disclosure.

FIG. 8B is an output timing diagram of selective AF processing using a direction filter according to an embodiment of the disclosure.

Referring to FIG. 8B, in response to a timing signal SENSOR_VSYNC of an image sensor 810, the image sensor 810 may store AF data SAVE_LR and SAVE_TB at a specified time interval.

While the storage of the horizontal data SAVE_LR and the vertical data SAVE_TB proceed, a PAF circuit 835 may perform edge detection (or directionality determination of an image) using a direction filter 870.

After the storage of the horizontal data SAVE_LR and the vertical data SAVE_TB is ended, the PAF circuit 835 may proceed with PAF for one direction selected by means of the direction filter 870. In a state where the timing signal SENSOR_VSYNC is low, one PAF may proceed.

Figure 9:
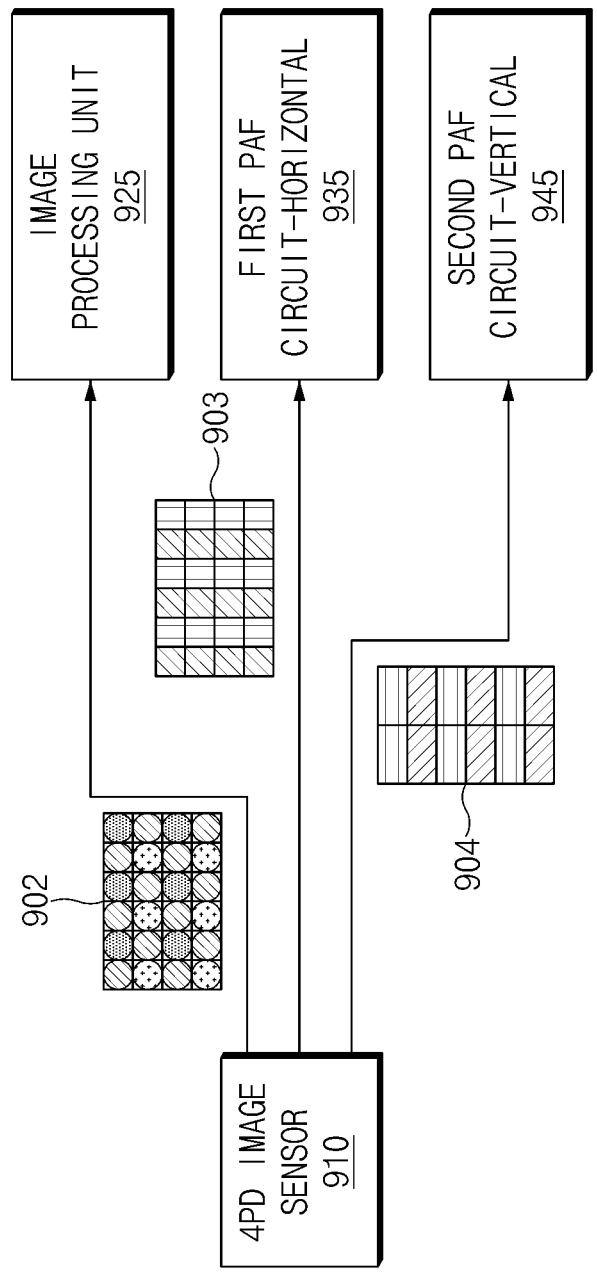
FIG. 9 illustrates AF processing using two 2PD PAF circuits in a processing pattern according to an embodiment of the disclosure.

FIG. 9 illustrates AF processing using two 2PD PAF circuits in a processing pattern according to an embodiment of the disclosure. The two 2PD PAF circuits are illustratively shown in FIG. 9, but not limited thereto.

Referring to FIG. 9, a 4PD image sensor 910 may include four PDs in one pixel. The 4PD image sensor 910 may integrate values of four PDs included in one pixel to generate image data 902. The 4PD image sensor 910 may transmit the image data 902 to an image processing unit (e.g., an ISP) 925.

The 4PD image sensor 910 may deliver first processing data 903 obtained by processing AF data in a first direction (e.g., a horizontal direction) to a first PAF circuit 935.

The 4PD image sensor 910 may deliver second processing data 904 obtained by processing AF data in a second direction (e.g., a vertical direction) to a second PAF circuit 945.

Each of the first PAF circuit 935 and the second PAF circuit 945 may perform PAF calculation for a different direction. The first PAF circuit 935 and the second PAF circuit 945 may perform AF calculation at the same time. As a result, quick and accurate AF may be performed.

It is illustratively shown that the two PAF circuits are included in FIG. 9, but not limited thereto. For example, AF data for eight directions may be simultaneously and separately processed by eight PAF circuits.

Figure 10:
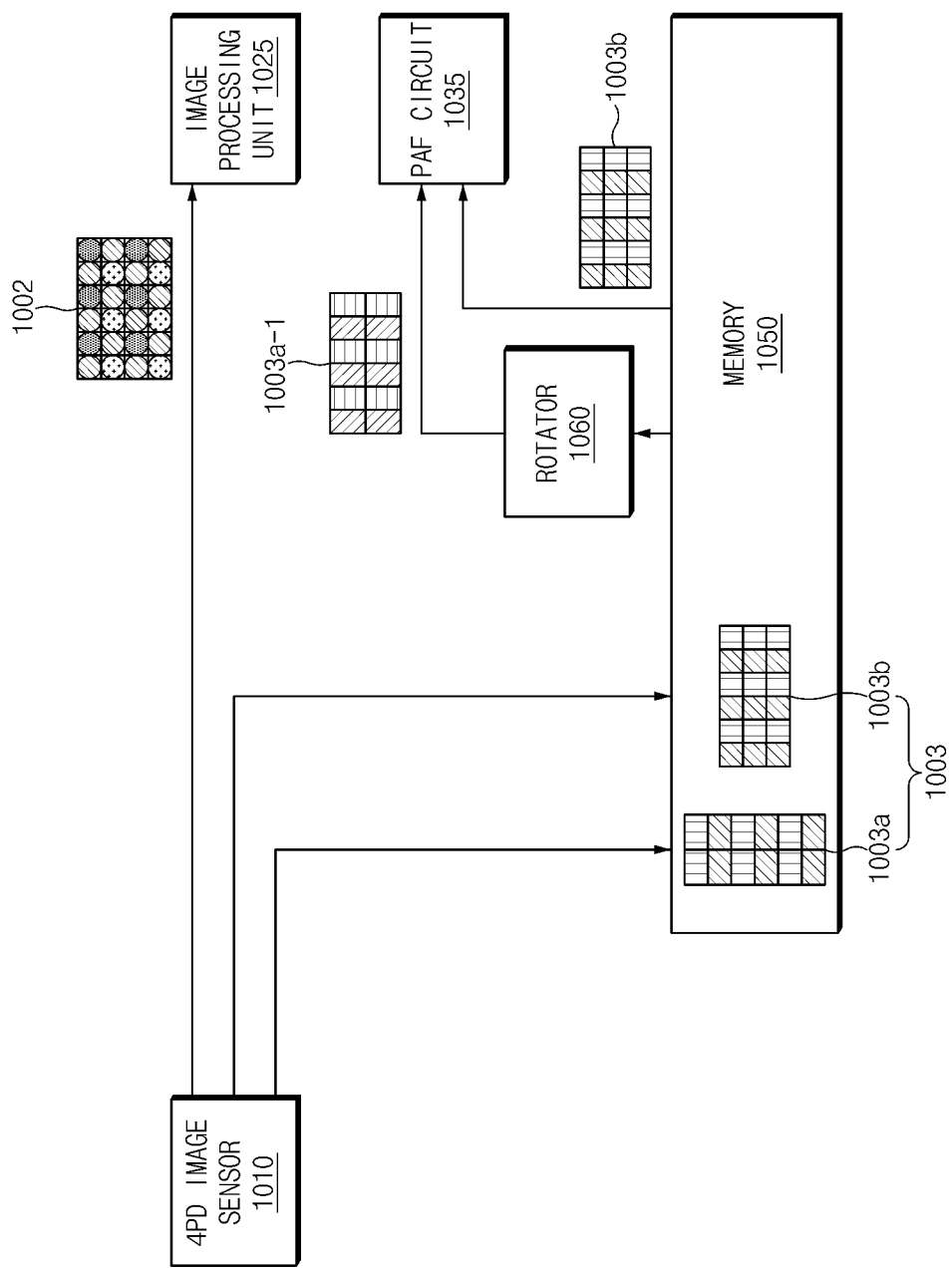
FIG. 10 illustrates AF processing using one 2PD PAF circuit in a processing pattern according to an embodiment of the disclosure.

FIG. 10 illustrates AF processing using one 2PD PAF circuit in a processing pattern according to an embodiment of the disclosure.

Referring to FIG. 10, a 4PD image sensor 1010 may include four PDs in one pixel. The 4PD image sensor 1010 may integrate values of four PDs included in one pixel to generate image data 1002. The 4PD image sensor 1010 may transmit the image data 1002 to an image processing unit (e.g., an ISP) 1025.

The 4PD image sensor 1010 may store first processing data 903 obtained by processing AF data in a first direction (e.g., a horizontal direction) in a memory (e.g., a DRAM) 1050. For example, vertical data 1003*a* and horizontal data 1003*b* may be stored.

The memory 1050 may store the AF data 1003. A memory 1050 may be a memory buffer included in a camera module or a memory area formed independently of the camera module.

A PAF circuit 1035 may process the AF data 1003 stored for each direction from the memory 1050. According to an embodiment of the disclosure, the PAF circuit 1035 may sequentially process the AF data 1003 depending on a direction. For example, the PAF circuit 1035 may primarily process the horizontal data 1003*b* and may secondarily process the vertical data 1003*a*.

According to an embodiment of the disclosure, a rotator 1060 may rotate and deliver signals in the other directions except for the first direction (e.g., the horizontal direction) to the PAF circuit 1035. For example, the vertical data 1003*a* may rotate at 90 degrees to be provided to the PAF circuit 1035 (1003*a*-1). As a result, the horizontal data 1003*b* and the converted vertical data 1003*a*-1 may have a data structure similar to each other, and the calculation process of the PAF circuit 1035 may be simplified.

Figure 11:
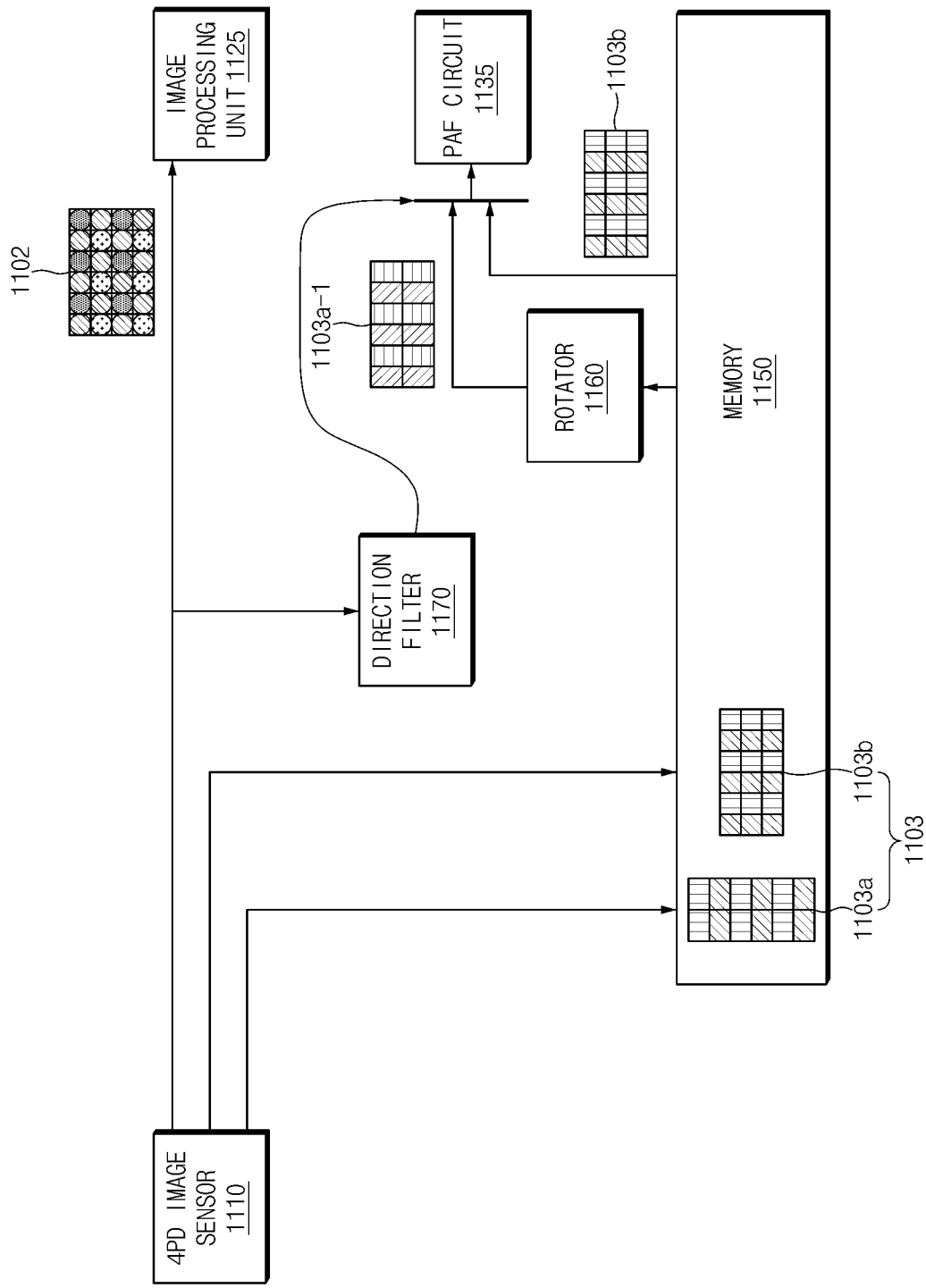
FIG. 11 illustrates AF processing using a direction filter in a processing pattern according to an embodiment of the disclosure.

FIG. 11 illustrates AF processing using a direction filter in a processing pattern according to an embodiment of the disclosure.

Referring to FIG. 11, a 4PD image sensor 1110 may include 4 PDs in one pixel. The 4PD image sensor 1110 may integrate values of four PDs included in one pixel to generate image data 1102. The 4PD image sensor 1110 may transmit the image data 1102 to an image processing unit (e.g., an ISP) 1125.

The 4PD image sensor 1110 may store first processing data 1103 obtained by processing AF data in a first direction (e.g., a horizontal direction) in a memory (e.g., a DRAM) 1150. For example, vertical data 1103*a* and horizontal data 1103*b* may be stored.

The memory 1150 may store the AF data 1103. A memory 1150 may be a memory buffer included in a camera module or a memory area formed independently of the camera module.

A direction filter 1160 may detect an edge direction, using the AF data 1103. The PAF circuit 1135 may process AF data for one direction among the AF data 1103 stored for each direction from the memory 1150. The PAF circuit 1135 may perform one PAF calculation for one direction determined by means of the direction filter 1170.

For example, the vertical data 1103*a* which is one direction according to an arrangement direction of an edge (or an arrangement direction of an object) may be selected between the horizontal data 1103*a* and the vertical data 1103*b*. The PAF circuit 1135 may rotate the vertical data 1103*a* by means of a rotator 1160 (1103*a*-1) to perform one PAF calculation.

According to an embodiment of the disclosure, the rotator 1160 may rotate and deliver signals in the other directions except for the first direction (e.g., the horizontal direction) to the PAF circuit 1135. For example, the vertical data 1103*a* may rotate at 90 degrees to be provided to the PAF circuit 1135 (1103*a*-1). As a result, the horizontal data 1103*b* and the converted vertical data 1103*a*-1 may have a data structure similar to each other, and the calculation process of the PAF circuit 1135 may be simplified.

Figure 12A:
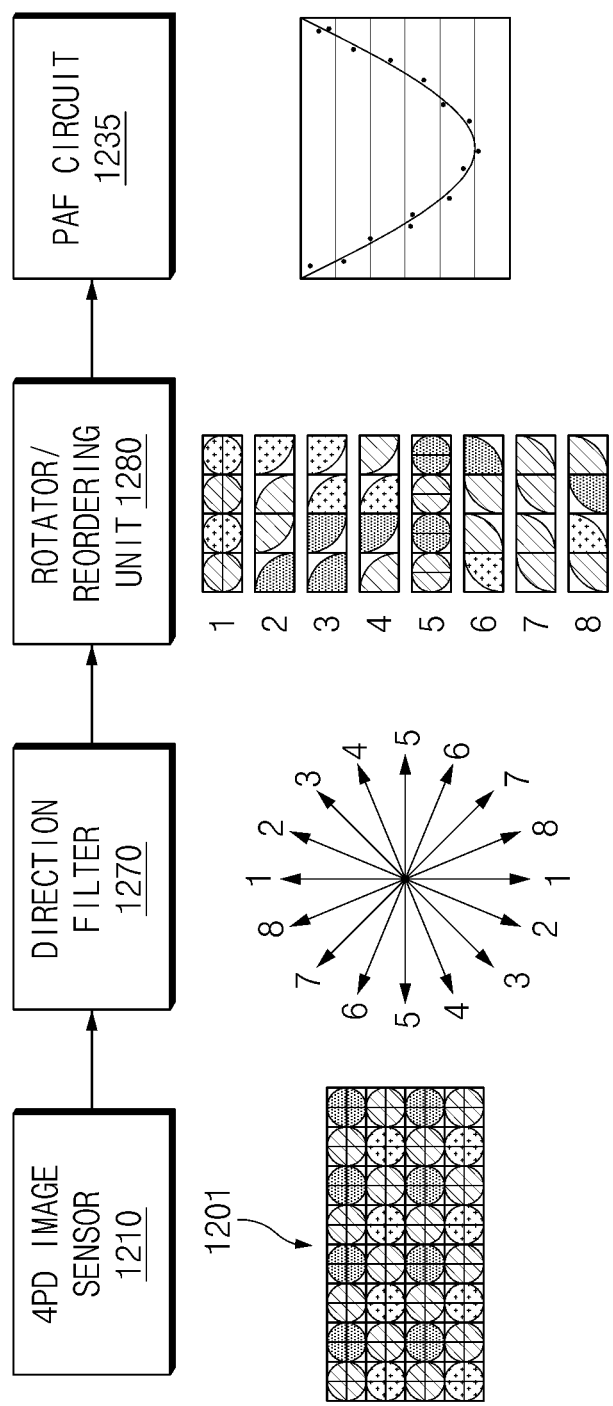
FIGS. 12A and 12B are drawings illustrating detecting an edge in a plurality of directions by means of a direction filter and performing PAF calculation according to various embodiments of the disclosure.
Figure 12B:
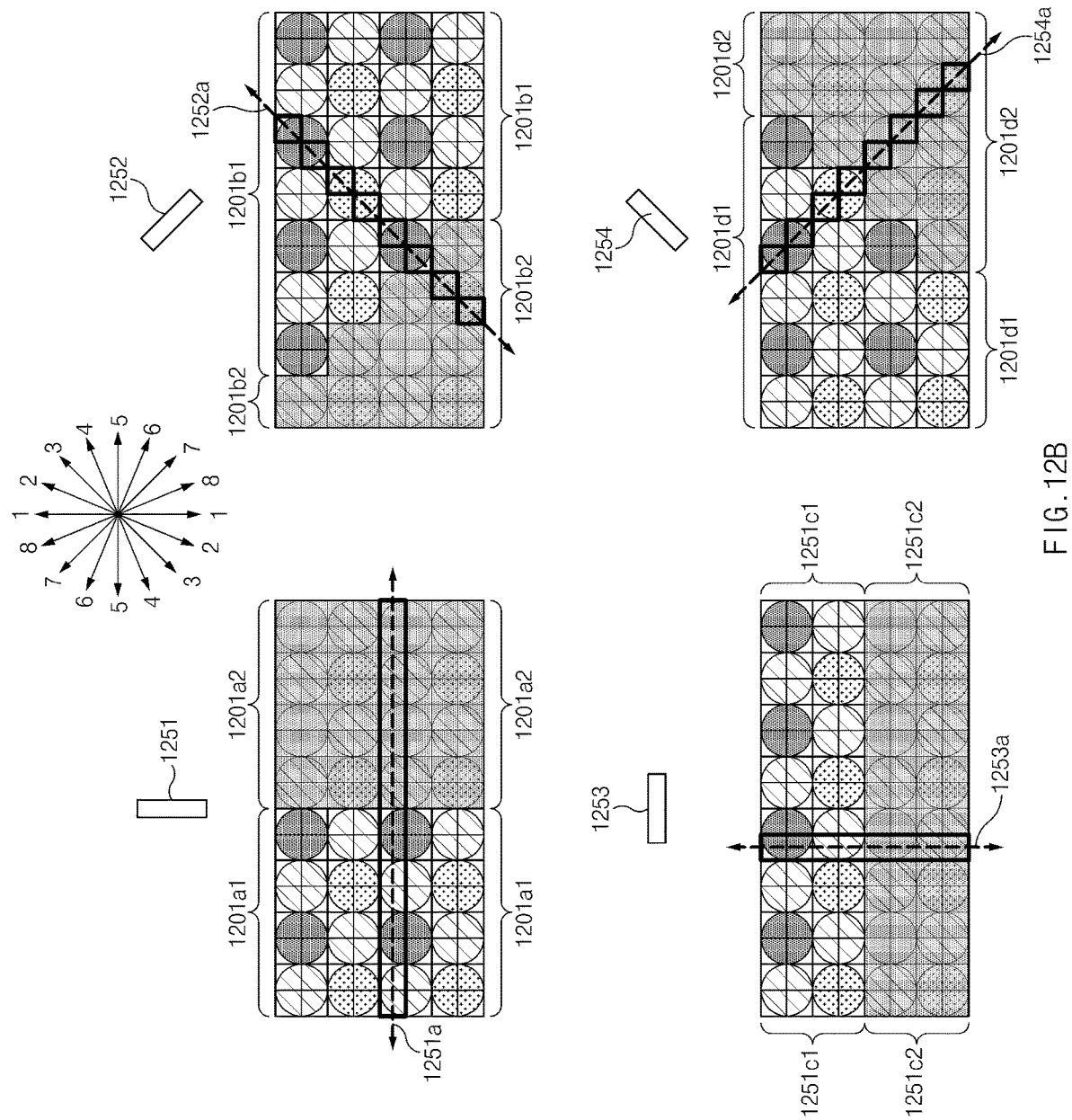

FIGS. 12A and 12B are drawings illustrating detecting an edge in a plurality of directions by means of a direction filter and performing PAF calculation according to various embodiments of the disclosure.

Referring to FIG. 12A, a 4PD image sensor 1210 may include four PDs in one pixel. The 4PD image sensor 1210 may sequentially read out PDs included in each pixel to generate a multi-PD signal (or raw data) 1201.

A direction filter 1270 may compare detection values for the plurality of directions, in AF data using the multi-PD signal (or the raw data), to detect directionality (an edge direction) of an image. For example, when data of a first portion and a second portion are changed to a specified value or more by an external object among all pixels of the AF data, it may be determined that a boundary (edge) of the first portion and the second portion is formed.

Referring to FIG. 12B, data of a first portion 1201*a*1 and a second portion 1201*a*2 of the 4PD image sensor 1210 may be changed to the specified value or more by a first object 1251. The direction filter 1270 may compare values of image data to detect an edge direction 1251*a* perpendicular to a boundary of the first portion 1201*a*1 and the second portion 1201*a*2 as a fifth direction (0 degree).

For another example, data of a first portion 1201*b*1 and a second portion 1201*b*2 of the 4PD image sensor 1210 may be changed to the specified value or more by a second object 1252. The direction filter 1270 may compare values of image data to detect an edge direction 1252*a* perpendicular to a boundary of the first portion 1201*b*1 and the second portion 1201*b*2 as a third direction (45 degrees).

For example, data of a first portion 1201*c*1 and a second portion 1201*c*2 of the 4PD image sensor 1210 may be changed to the specified value or more by a third object 1253. The direction filter 1270 may compare values of image data to detect an edge direction 1253*a* perpendicular to a boundary of the first portion 1201*c*1 and the second portion 1201*c*2 as a first direction (90 degrees).

For another example, data of a first portion 1201*d*1 and a second portion 1201*d*2 of the 4PD image sensor 1210 may be changed to the specified value or more by a fourth object 1254. The direction filter 1270 may compare values of image data to detect an edge direction 1254*a* perpendicular to a boundary of the first portion 1201*d*1 and the second portion 1201*d*2 as a seventh direction (135 degrees).

A reordering unit 1280 may rotate or reorder AF data for each direction (or a direction where an edge is mainly disposed). The reordering unit 1280 may rotate or reorder AF data in an edge direction 1251*a*, 1252*a*, 1253*a*, or 1254*a* perpendicular to the boundary of the first portion 1201*a*1, 1201*b*1, 1201*c*1, or 1201*d*1 and the second portion 1201*a*2, 1201*b*2, 1201*c*2, or 1201*d*2. As a result, the PAF circuit 1235 may perform PAF calculation depending on directionality of an edge.

Although the PAF circuit 1235 performs determined calculation irrespective of information about directionality, it may perform PAF calculation depending on directionality of an edge to obtain a PAF result with high reliability. The PAF circuit 1235 may extract a statistical value for each direction and may perform AF determination.

Figure 13:
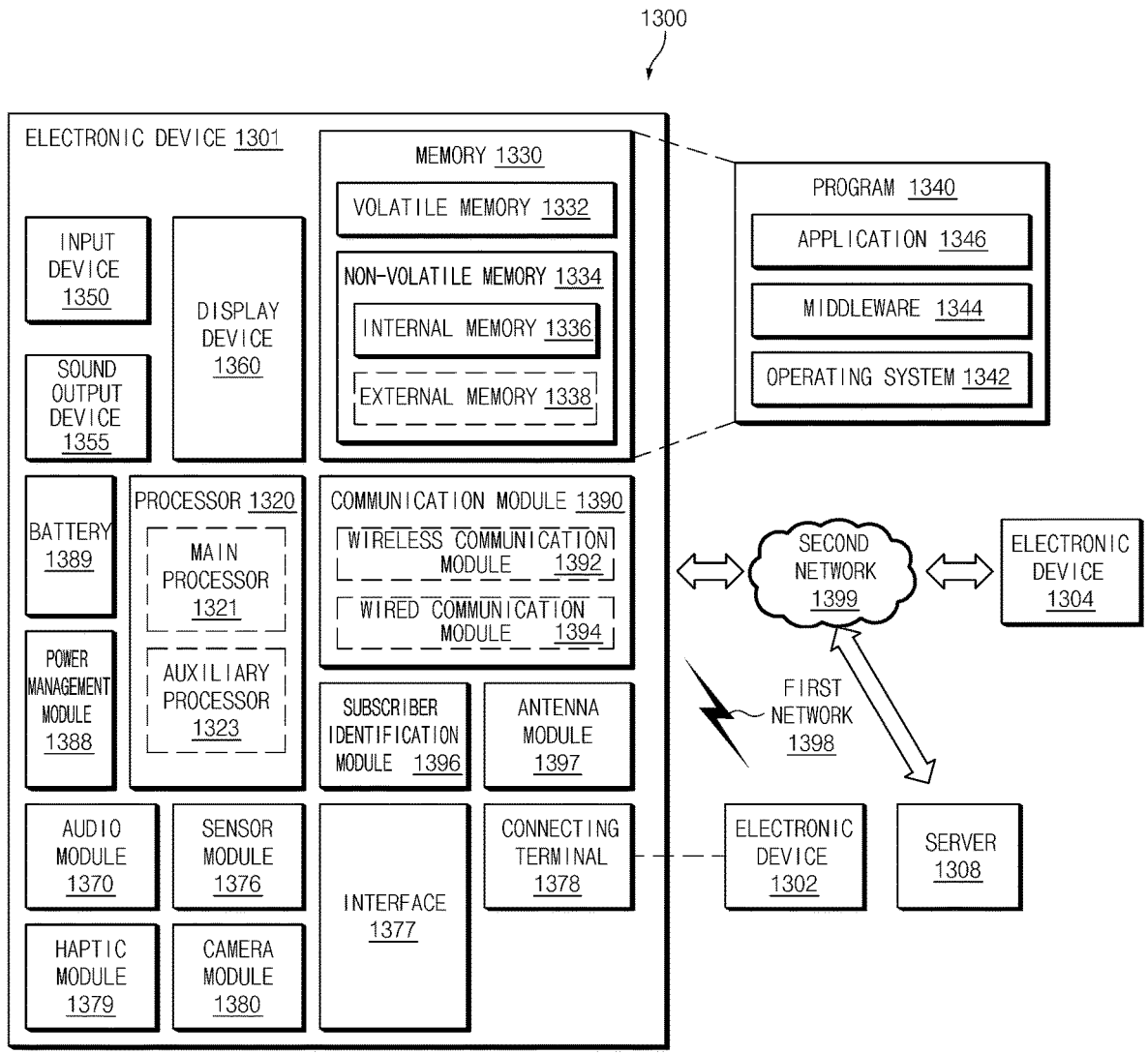
FIG. 13 is a block diagram illustrating an electronic device in a network environment according to an embodiment of the disclosure.

FIG. 13 is a block diagram of an electronic device 1301 in a network environment 1300 according to an embodiment of the disclosure. The electronic device according to various embodiments disclosed in this document may be a device of various types. The electronic device includes, for example, at least one of a portable communication device (e.g., smartphone), a computer device (e.g., a personal digital assistant; PDA), a tablet PC, a laptop PC (a desktop PC, a workstation, or a server), a portable multimedia device (e.g., an e-book readers or a Moving Picture Experts Group phase 1 or phase 2 (MPEG-1 or MPEG-2) audio layer 3 (MP3) players), a portable medical device devices (e.g., heartbeat measuring devices, blood glucose monitoring devices, blood pressure measuring devices, and body temperature measuring devices), a camera, or a wearable device. The wearable device may include at least one of an accessory type (e.g., watches, rings, bracelets, anklets, necklaces, glasses, contact lens, or head-mounted-devices (HMDs)), a fabric or garment-integrated type (e.g., an electronic apparel), a body-attached type (e.g., a skin pad or tattoos), or a bio-implantable type (e.g., an implantable circuit). According to various embodiments of the disclosure, the electronic device may include at least one of, for example, televisions (TVs), digital versatile disc (DVD) players, audios, audio accessory devices (e.g., speakers, headphones, or headsets), refrigerators, air conditioners, cleaners, ovens, microwave ovens, washing machines, air cleaners, set-top boxes, home automation control panels, security control panels, game consoles, electronic dictionaries, electronic keys, camcorders, or electronic picture frames.

In another embodiment of the disclosure, the electronic device may include at least one of navigation devices, satellite navigation system (e.g., Global Navigation Satellite System (GNSS)), event data recorders (EDRs) (e.g., black box for a car, a ship, or a plane), vehicle infotainment devices (e.g., head-up display for vehicle), industrial or home robots, drones, automatic teller's machines (ATMs), points of sales (POSs), measuring instruments (e.g., water meters, electricity meters, or gas meters), or internet of things (e.g., light bulbs, sprinkler devices, fire alarms, thermostats, or street lamps). The electronic device according to an embodiment of this disclosure may not be limited to the above-described devices, and may provide functions of a plurality of devices like smartphones which has measurement function of personal biometric information (e.g., heart rate or blood glucose). In this disclosure, the term "user" may refer to a person who uses an electronic device or may refer to a device (e.g., an artificial intelligence electronic device) that uses the electronic device.

FIG. 13 is a block diagram illustrating an electronic device 1301 (e.g., the foldable electronic device 101 of FIG. 1) in a network environment 1300 according to various embodiments.

Referring to FIG. 13, the electronic device 1301 in the network environment 1300 may communicate with an external electronic device 1302 via a first network 1398 (e.g., a short-range wireless communication network), or at least one of an external electronic device 1304 or a server 1308 via a second network 1399 (e.g., a long-range wireless communication network). According to an embodiment of the disclosure, the electronic device 1301 may communicate with the external electronic device 1304 via the server 1308. According to an embodiment of the disclosure, the electronic device 1301 may include a processor 1320, a memory 1330, an input module 1350, a sound output module 1355, a display module 1360, an audio module 1370, a sensor module 1376, an interface 1377, a connecting terminal 1378, a haptic module 1379, a camera module 1380, a power management module 1388, a battery 1389, a communication module 1390, a subscriber identification module (SIM) 1396, or an antenna module 1397. In some embodiments of the disclosure, at least one of the components (e.g., the connecting terminal 1378) may be omitted from the electronic device 1301, or one or more other components may be added in the electronic device 1301. In some embodiments of the disclosure, some of the components (e.g., the sensor module 1376, the camera module 1380, or the antenna module 1397) may be implemented as a single component (e.g., the display module 1360).

The processor 1320 may execute, for example, software (e.g., a program 1340) to control at least one other component (e.g., a hardware or software component) of the electronic device 1301 coupled with the processor 1320, and may perform various data processing or computation. According to one embodiment of the disclosure, as at least part of the data processing or computation, the processor 1320 may store a command or data received from another component (e.g., the sensor module 1376 or the communication module 1390) in a volatile memory 1332, process the command or the data stored in the volatile memory 1332, and store resulting data in a non-volatile memory 1334. According to an embodiment of the disclosure, the processor 1320 may include a main processor 1321 (e.g., a central processing unit (CPU) or an application processor (AP)), or an auxiliary processor 1323 (e.g., a graphics processing unit (GPU), a neural processing unit (NPU), an image signal processor (ISP), a sensor hub processor, or a communication processor (CP)) that is operable independently from, or in conjunction with, the main processor 1321. For example, when the electronic device 1301 includes the main processor 1321 and the auxiliary processor 1323, the auxiliary processor 1323 may be adapted to consume less power than the main processor 1321, or to be specific to a specified function. The auxiliary processor 1323 may be implemented as separate from, or as part of the main processor 1321.

The auxiliary processor 1323 may control at least some of functions or states related to at least one component (e.g., the display module 1360, the sensor module 1376, or the communication module 1390) among the components of the electronic device 1301, instead of the main processor 1321 while the main processor 1321 is in an inactive (e.g., sleep) state, or together with the main processor 1321 while the main processor 1321 is in an active state (e.g., executing an application). According to an embodiment of the disclosure, the auxiliary processor 1323 (e.g., an image signal processor or a communication processor) may be implemented as part of another component (e.g., the camera module 1380 or the communication module 1390) functionally related to the auxiliary processor 1323. According to an embodiment of the disclosure, the auxiliary processor 1323 (e.g., the neural processing unit) may include a hardware structure specified for artificial intelligence model processing. An artificial intelligence model may be generated by machine learning. Such learning may be performed, e.g., by the electronic device 1301 where the artificial intelligence is performed or via a separate server (e.g., the server 1308). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1330 may store various data used by at least one component (e.g., the processor 1320 or the sensor module 1376) of the electronic device 1301. The various data may include, for example, software (e.g., the program 1340) and input data or output data for a command related thereto. The memory 1330 may include the volatile memory 1332 or the non-volatile memory 1334.

The program 1340 may be stored in the memory 1330 as software, and may include, for example, an operating system (OS) 1342, middleware 1344, or an application 1346.

The input module 1350 may receive a command or data to be used by another component (e.g., the processor 1320) of the electronic device 1301, from the outside (e.g., a user) of the electronic device 1301. The input module 1350 may include, for example, a microphone, a mouse, a keyboard, a key (e.g., a button), or a digital pen (e.g., a stylus pen).

The sound output module 1355 may output sound signals to the outside of the electronic device 1301. The sound output module 1355 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 1360 may visually provide information to the outside (e.g., a user) of the electronic device 1301. The display module 1360 may include, for example, a display, a hologram device, or a projector and control circuitry to control a corresponding one of the display, hologram device, and projector. According to an embodiment of the disclosure, the display module 1360 may include a touch sensor adapted to detect a touch, or a pressure sensor adapted to measure the intensity of force incurred by the touch.

The audio module 1370 may convert a sound into an electrical signal and vice versa. According to an embodiment of the disclosure, the audio module 1370 may obtain the sound via the input module 1350, or output the sound via the sound output module 1355 or a headphone of an external electronic device (e.g., an external electronic device 1302) directly (e.g., wiredly) or wirelessly coupled with the electronic device 1301.

The sensor module 1376 may detect an operational state (e.g., power or temperature) of the electronic device 1301 or an environmental state (e.g., a state of a user) external to the electronic device 1301, and then generate an electrical signal or data value corresponding to the detected state. According to an embodiment of the disclosure, the sensor module 1376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1377 may support one or more specified protocols to be used for the electronic device 1301 to be coupled with the external electronic device (e.g., the external electronic device 1302) directly (e.g., wiredly) or wirelessly. According to an embodiment of the disclosure, the interface 1377 may include, for example, a high definition multimedia interface (HDMI), a universal serial bus (USB) interface, a secure digital (SD) card interface, or an audio interface.

A connecting terminal 1378 may include a connector via which the electronic device 1301 may be physically connected with the external electronic device (e.g., the external electronic device 1302). According to an embodiment of the disclosure, the connecting terminal 1378 may include, for example, a HDMI connector, a USB connector, an SD card connector, or an audio connector (e.g., a headphone connector).

The haptic module 1379 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 1379 may include, for example, a motor, a piezoelectric element, or an electric stimulator.

The camera module 1380 may capture a still image or moving images. According to an embodiment of the disclosure, the camera module 1380 may include one or more lenses, image sensors, image signal processors, or flashes.

The power management module 1388 may manage power supplied to the electronic device 1301. According to one embodiment of the disclosure, the power management module 1388 may be implemented as at least part of, for example, a power management integrated circuit (PMIC).

The battery 1389 may supply power to at least one component of the electronic device 1301. According to an embodiment of the disclosure, the battery 1389 may include, for example, a primary cell which is not rechargeable, a secondary cell which is rechargeable, or a fuel cell.

The communication module 1390 may support establishing a direct (e.g., wired) communication channel or a wireless communication channel between the electronic device 1301 and the external electronic device (e.g., the external electronic device 1302, the external electronic device 1304, or the server 1308) and performing communication via the established communication channel. The communication module 1390 may include one or more communication processors that are operable independently from the processor 1320 (e.g., the application processor (AP)) and supports a direct (e.g., wired) communication or a wireless communication. According to an embodiment of the disclosure, the communication module 1390 may include a wireless communication module 1392 (e.g., a cellular communication module, a short-range wireless communication module, or a global navigation satellite system (GNSS) communication module) or a wired communication module 1394 (e.g., a local area network (LAN) communication module or a power line communication (PLC) module). A corresponding one of these communication modules may communicate with the external electronic device via the first network 1398 (e.g., a short-range communication network, such as Bluetooth™, wireless-fidelity (Wi-Fi) direct, or infrared data association (IrDA)) or the second network 1399 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1392 may identify and authenticate the electronic device 1301 in a communication network, such as the first network 1398 or the second network 1399, using subscriber information (e.g., international mobile subscriber identity (IMSI)) stored in the subscriber identification module 1396.

The antenna module 1397 may transmit or receive a signal or power to or from the outside (e.g., the external electronic device) of the electronic device 1301. According to an embodiment of the disclosure, the antenna module 1397 may include an antenna including a radiating element composed of a conductive material or a conductive pattern formed in or on a substrate (e.g., printed circuit board (PCB)). According to an embodiment of the disclosure, the antenna module 1397 may include a plurality of antennas. In such a case, at least one antenna appropriate for a communication scheme used in the communication network, such as the first network 1398 or the second network 1399, may be selected, for example, by the communication module 1390 (e.g., the wireless communication module 1392) from the plurality of antennas. The signal or the power may then be transmitted or received between the communication module 1390 and the external electronic device via the selected at least one antenna. According to an embodiment of the disclosure, another component (e.g., a radio frequency integrated circuit (RFIC)) other than the radiating element may be additionally formed as part of the antenna module 1397.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 1301 and the external electronic device 1304 via the server 1308 coupled with the second network 1399. Each of the external electronic devices 1302 and 1304 may be a device of a same type as, or a different type, from the electronic device 1301. According to an embodiment of the disclosure, all or some of operations to be executed at the electronic device 1301 may be executed at one or more of the external electronic devices 1302, 1304, or 1308. For example, if the electronic device 1301 should perform a function or a service automatically, or in response to a request from a user or another device, the electronic device 1301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1301. The electronic device 1301 may provide the outcome, with or without further processing of the outcome, as at least part of a reply to the request. To that end, a cloud computing, distributed computing, or client-server computing technology may be used, for example.

Figure 14:
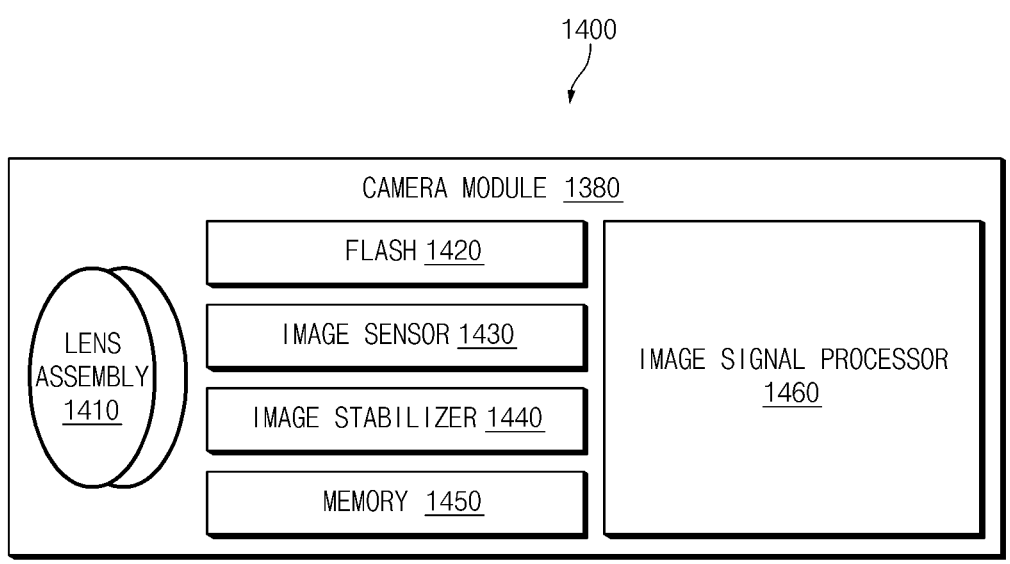
FIG. 14 is a block diagram illustrating a camera module according to an embodiment of the disclosure.

FIG. 14 is a block diagram 1400 illustrating the camera module 1380 according to an embodiment of the disclosure.

Referring to FIG. 14, the camera module 1380 may include a lens assembly 1410, a flash 1420, an image sensor 1430, an image stabilizer 1440, a memory 1450 (e.g., buffer memory), or an image signal processor 1460. The lens assembly 1410 may collect light emitted or reflected from an object whose image is to be taken. The lens assembly 1410 may include one or more lenses. According to an embodiment of the disclosure, the camera module 1380 may include a plurality of lens assemblies 1410. In such a case, the camera module 1380 may form, for example, a dual camera, a 360-degree camera, or a spherical camera. Some of the plurality of lens assemblies 1410 may have the same lens attribute (e.g., view angle, focal length, auto-focusing, f number, or optical zoom), or at least one lens assembly may have one or more lens attributes different from those of another lens assembly. The lens assembly 1410 may include, for example, a wide-angle lens or a telephoto lens.

The flash 1420 may emit light that is used to reinforce light reflected from an object. According to an embodiment of the disclosure, the flash 1420 may include one or more light emitting diodes (LEDs) (e.g., a red-green-blue (RGB) LED, a white LED, an infrared (IR) LED, or an ultraviolet (UV) LED) or a xenon lamp. The image sensor 1430 may obtain an image corresponding to an object by converting light emitted or reflected from the object and transmitted via the lens assembly 1410 into an electrical signal. According to an embodiment of the disclosure, the image sensor 1430 may include one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor included in the image sensor 1430 may be implemented using, for example, a charged coupled device (CCD) sensor or a complementary metal oxide semiconductor (CMOS) sensor.

The image stabilizer 1440 may move the image sensor 1430 or at least one lens included in the lens assembly 1410 in a particular direction, or control an operational attribute (e.g., adjust the read-out timing) of the image sensor 1430 in response to the movement of the camera module 1380 or the electronic device 1301 including the camera module 1380. This allows compensating for at least part of a negative effect (e.g., image blurring) by the movement on an image being captured. According to an embodiment of the disclosure, the image stabilizer 1440 may sense such a movement by the camera module 1380 or the electronic device 1301 using a gyro sensor (not shown) or an acceleration sensor (not shown) disposed inside or outside the camera module 1380. According to an embodiment of the disclosure, the image stabilizer 1440 may be implemented, for example, as an optical image stabilizer. The memory 1450 may store, at least temporarily, at least part of an image obtained via the image sensor 1430 for a subsequent image processing task. For example, if image capturing is delayed due to shutter lag or multiple images are quickly captured, a raw image obtained (e.g., a Bayer-patterned image, a high-resolution image) may be stored in the memory 1450, and its corresponding copy image (e.g., a low-resolution image) may be previewed via the display device 1360. Thereafter, if a specified condition is met (e.g., by a user's input or system command), at least part of the raw image stored in the memory 1450 may be obtained and processed, for example, by the image signal processor 1460. According to an embodiment of the disclosure, the memory 1450 may be configured as at least part of the memory 1330 or as a separate memory that is operated independently from the memory 1330.

The image signal processor 1460 may perform one or more image processing with respect to an image obtained via the image sensor 1430 or an image stored in the memory 1450. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 1460 may perform control (e.g., exposure time control or read-out timing control) with respect to at least one (e.g., the image sensor 1430) of the components included in the camera module 1380. An image processed by the image signal processor 1460 may be stored back in the memory 1450 for further processing, or may be provided to an external component (e.g., the memory 1330, the display device 1360, the external electronic device 1302, the external electronic device 1304, or the server 1308) outside the camera module 1380. According to an embodiment of the disclosure, the image signal processor 1460 may be configured as at least part of the processor 1320, or as a separate processor that is operated independently from the processor 1320. If the image signal processor 1460 is configured as a separate processor from the processor 1320, at least one image processed by the image signal processor 1460 may be displayed, by the processor 1320, via the display device 1360 as it is or after being further processed.

According to an embodiment of the disclosure, the electronic device 1301 may include a plurality of camera modules 1380 having different attributes or functions. In such a case, at least one of the plurality of camera modules 1380 may form, for example, a wide-angle camera and at least another of the plurality of camera modules 1380 may form a telephoto camera. Similarly, at least one of the plurality of camera modules 1380 may form, for example, a front camera and at least another of the plurality of camera modules 1380 may form a rear camera.

FIG. 13 is a block diagram illustrating an electronic device in a network environment according to an embodiment of the disclosure. FIG. 14 is a block diagram illustrating a camera module according to an embodiment of the disclosure.

Referring to FIGS. 13 and 14, an electronic device 1301 according to various embodiments may include an image sensor 1414 (e.g., an image sensor 200 of FIG. 2 or an image sensor 1430 of FIG. 14) including a plurality of pixels, an AF processing unit (e.g., an AF processing unit 450 of FIG. 4) for performing calculation for performing auto focus based on a phase difference, a memory (e.g., a memory 430 of FIG. 4, a memory 1330 of FIG. 13, or a memory 1450 of FIG. 14), and a controller (e.g., a controller 420 of FIG. 4) for delivering data obtained by the image sensor (e.g., the image sensor 200 of FIG. 2 or the image sensor 1430 of FIG. 14) to the AF processing unit or the memory (e.g., the memory 430 of FIG. 4, the memory 1330 of FIG. 13, or the memory 1450 of FIG. 14). Each pixel included in the plurality of pixels may include a plurality of photo diodes and a microlens for covering the plurality of photo diodes. The controller (e.g., the controller 420 of FIG. 4) may provide the AP processing unit (e.g., the AF processing unit 450 of FIG. 4) with at least one of first AF data of photo diodes arranged in a first direction among the plurality of photo diodes or second AF data of photo diodes arranged in a second direction among the plurality of photo diodes. The AF processing unit (e.g., the AF processing unit 450 of FIG. 4) may perform first phase auto focus (PAF) calculation based on the first AF data or may perform second PAF calculation based on the second AF data.

According to various embodiments of the disclosure, the AF processing unit (e.g., the AF processing unit 450 of FIG. 4) may include a first AF circuit and a second AF circuit. The second AF circuit may perform the second phase auto focus (PAF) calculation, while the first AF circuit performs the first phase auto focus (PAF) calculation.

According to various embodiments of the disclosure, the AF processing unit (e.g., the AF processing unit 450 of FIG. 4) may include one AF circuit. The AF circuit may perform the first phase auto focus (PAF) calculation and may perform the second PAF, when the first phase auto focus (PAF) calculation is ended.

According to various embodiments of the disclosure, the controller (e.g., the controller 420 of FIG. 4) may rotate the second AF data to correspond to the first direction and may provide the AF processing unit (e.g., the AF processing unit 450 of FIG. 4) with the second AF data.

According to various embodiments of the disclosure, the AF processing unit (e.g., the AF processing unit 450 of FIG. 4) may select one of the first direction or the second direction by means of a direction filter and may perform PAF calculation for AF data corresponding to the selected direction.

According to various embodiments of the disclosure, the controller (e.g., the controller 420 of FIG. 4) may store the first AF data or the second AF data in the memory (e.g., the memory 430 of FIG. 4, the memory 1330 of FIG. 13, or the memory 1450 of FIG. 14). The controller (e.g., the controller 420 of FIG. 4) may rotate or reorder and store at least one of the first AF data or the second AF data in the memory (e.g., the memory 430 of FIG. 4, the memory 1330 of FIG. 13, or the memory 1450 of FIG. 14).

According to various embodiments of the disclosure, the controller (e.g., the controller 420 of FIG. 4) may provide the AF processing unit (e.g., the AF processing unit 450 of FIG. 4) with the first AF data or the second AF data with a Bayer pattern or a processing pattern.

According to various embodiments of the disclosure, the AF processing unit (e.g., the AF processing unit 450 of FIG. 4) may perform the first PAF calculation during a process where the first AF data and the second AF data are stored in the memory (e.g., the memory 430 of FIG. 4, the memory 1330 of FIG. 13, or the memory 1450 of FIG. 14) and may calculate the second PAF calculation after the process is ended.

According to various embodiments of the disclosure, the AF processing unit (e.g., the AF processing unit 450 of FIG. 4) may perform the first PAF calculation while the first AF data and the second AF data are read out by means of the image sensor (e.g., the image sensor 200 of FIG. 2 or the image sensor 1430 of FIG. 14) and may perform the second PAF calculation after the readout is ended.

According to various embodiments of the disclosure, the image sensor (e.g., the image sensor 200 of FIG. 2 or the image sensor 1430 of FIG. 14) may be formed such that one microlens covers four photo diodes. The AF processing unit (e.g., the AF processing unit 450 of FIG. 4) may compare measurement values of the two photo diodes to perform PAF calculation.

An electronic device (e.g., an electronic device 100 of FIG. 1 or an electronic device 1301 of FIG. 13) according to various embodiments of the disclosure may include an image sensor (e.g., an image sensor 200 of FIG. 2 or an image sensor 1430 of FIG. 14) including a plurality of pixels, wherein each pixel included in the plurality of pixels includes a plurality of photo diodes and a microlens for covering the plurality of photo diodes, an AF processing unit (e.g., an AF processing unit 450 of FIG. 4) for performing calculation for performing auto focus based on a phase difference, a memory (e.g., a memory 430 of FIG. 4, a memory 1330 of FIG. 13, or a memory 1450 of FIG. 14), and a controller (e.g., a controller 420 of FIG. 4) for delivering data obtained by the image sensor (e.g., the image sensor 200 of FIG. 2 or the image sensor 1430 of FIG. 14) to the AF processing unit or the memory (e.g., the memory 430 of FIG. 4, the memory 1330 of FIG. 13, or the memory 1450 of FIG. 14). The controller (e.g., the controller 420 of FIG. 4) may set priorities based on measurement values of photo diodes corresponding to a plurality of directions. The AF processing unit (e.g., the AF processing unit 450 of FIG. 4) may perform PAF calculation, based on the priorities.

According to various embodiments of the disclosure, the AF processing unit (e.g., the AF processing unit 450 of FIG. 4) may include a plurality of PAF circuits respectively corresponding to the plurality of directions. Each of the plurality of PAF circuits may start PAF calculation at the same time.

According to various embodiments of the disclosure, the AF processing unit (e.g., the AF processing unit 450 of FIG. 4) may include one AF circuit. The AF circuit may sequentially perform the PAF calculation in the priorities.

A method for performing auto focus (AF) performed in an electronic device (e.g., an electronic device 100 of FIG. 1 or an electronic device 1301 of FIG. 13) according to various embodiments of the disclosure may include obtaining image data by means of an image sensor (e.g., an image sensor 200 of FIG. 2 or an image sensor 1430 of FIG. 14) including a plurality of pixels, obtaining first AF data of photo diodes arranged in a first direction among a plurality of photo diodes included in each pixel included in the plurality of pixels based on the image data, obtaining second AF data of photo diodes arranged in a second direction among the plurality of photo diodes based on the image data, and performing first phase auto focus (PAF) calculation based on the first AF data or performing second PAF calculation based on the second AF data.

According to various embodiments of the disclosure, the electronic device (e.g., the electronic device 100 of FIG. 1 or the electronic device 1301 of FIG. 13) may include a first AF circuit and a second AF circuit. The performing of the first PAF calculation or the second PAF calculation may include performing the second phase auto focus (PAF) calculation by means of the second AF circuit, while performing the first phase auto focus (PAF) by means of the first AF circuit.

According to various embodiments of the disclosure, the electronic device (e.g., the electronic device 100 of FIG. 1 or the electronic device 1301 of FIG. 13) may include one AF circuit. The performing of the first PAF calculation or the second PAF calculation may include performing the first phase auto focus (PAF) using the AF circuit and performing the second PAF calculation, when the first phase auto focus (PAF) calculation is ended.

According to various embodiments of the disclosure, the obtaining of the second AF data may include rotating the second AF data to correspond to the first direction.

According to various embodiments of the disclosure, the performing of the first PAF calculation or the second PAF calculation may include selecting one of the first direction or the second direction by means of a direction filter of the electronic device (e.g., the electronic device 100 of FIG. 1 or the electronic device 1301 of FIG. 13) and performing PAF calculation for AF data corresponding to the selected direction.

According to various embodiments of the disclosure, the method for performing the AF may further include storing the first AF data or the second AF data in a memory (e.g., a memory 430 of FIG. 4, a memory 1330 of FIG. 13, or a memory 1450 of FIG. 14) of the electronic device (e.g., the electronic device 100 of FIG. 1 or the electronic device 1301 of FIG. 13).

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 1340) including one or more instructions that are stored in a storage medium (e.g., an internal memory 1336 or an external memory 1338) that is readable by a machine (e.g., the electronic device 1301). For example, a processor (e.g., the processor 1320) of the machine (e.g., the electronic device 1301) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   an image sensor including a plurality of pixels, wherein each pixel included in the plurality of pixels includes a plurality of photo diodes and a microlens configured to cover the plurality of photo diodes;
   an auto focus (AF) processing unit including at least one AF circuit performing calculation for performing auto focus based on a phase difference;
   memory, comprising one or more storage media, storing instructions; and one or more processors communicatively coupled with the image sensor, the AF processing unit, and the memory,
wherein the instructions, when executed by the one or more processors individually or collectively, cause the electronic device to:
  deliver data obtained by the image sensor to the AF processing unit or the memory,
  provide the AF processing unit with first AF data of photo diodes arranged in a first direction among the plurality of photo diodes, and
  provide the AF processing unit with second AF data of photo diodes arranged in a second direction among the plurality of photo diodes by rotating or reordering the second AF data to have a data structure in the first direction, and
wherein the AF processing unit performs first phase auto focus (PAF) calculation based on the first AF data and performs second PAF calculation based on the second AF data.

2. The electronic device of claim 1,
wherein the AF processing unit includes a first AF circuit and a second AF circuit, and
wherein the second AF circuit performs the second PAF calculation, while the first AF circuit performs the first PAF calculation.

3. The electronic device of claim 1,
wherein the AF processing unit includes one AF circuit, and
wherein the AF circuit performs the first (PAF) calculation and performs the second PAF calculation, when the first (PAF) calculation is ended.

4. The electronic device of claim 1, wherein the AF processing unit selects one of the first direction or the second direction by means of a direction filter and performs PAF calculation for AF data corresponding to the selected direction.

5. The electronic device of claim 1, wherein the instructions, when executed by the one or more processors individually or collectively, further cause the electronic device to store the first AF data or the second AF data in the memory.

6. The electronic device of claim 1, wherein the instructions, when executed by the one or more processors individually or collectively, further cause the electronic device to provide the AF processing unit with the first AF data or the second AF data with a Bayer pattern or a processing pattern.

7. The electronic device of claim 1,
wherein the AF processing unit performs the first PAF calculation during a process where the first AF data and the second AF data are stored in the memory, and calculates the second PAF calculation after the process is ended.

8. The electronic device of claim 1,
wherein the AF processing unit performs the first PAF calculation while the first AF data and the second AF data are read out by means of the image sensor, and performs the second PAF calculation after the readout is ended.

9. The electronic device of claim 1,
wherein the image sensor is formed such that each microlens covers four photo diodes, and
wherein the AF processing unit compares measurement values of two photo diodes to perform PAF calculation.

10. The electronic device of claim 1,
wherein the instructions, when executed by the one or more processors individually or collectively, further cause the electronic device to set priorities based on measurement values of photo diodes corresponding to a plurality of directions including the first direction and the second direction, and
wherein the AF processing unit performs PAF calculation, based on the set priorities.

11. The electronic device of claim 10,
wherein the AF processing unit includes a plurality of PAF circuits respectively corresponding to the plurality of directions, and
wherein each of the plurality of PAF circuits starts the PAF calculation at the same time.

12. The electronic device of claim 10,
wherein the AF processing unit includes one AF circuit, and
wherein the AF processing unit sequentially performs PAF calculation according to the set priorities.

13. A method for performing auto focus (AF) performed in an electronic device, the method comprising:
  obtaining image data using an image sensor including a plurality of pixels;
  obtaining first AF data of photo diodes arranged in a first direction among a plurality of photo diodes included in each pixel included in the plurality of pixels based on the image data;
  obtaining second AF data of photo diodes arranged in a second direction among the plurality of photo diodes based on the image data by rotating or reordering the second AF data to have a data structure in the first direction; and
  performing first (PAF) calculation based on the first AF data and second PAF calculation based on the second AF data.

14. The method of claim 13, further comprising:
  selecting, by the AF processing unit, one of the first direction or the second direction using a direction filter; and
  performing PAF calculation for AF data corresponding to the selected direction.

15. The method of claim 13, further comprising:
  storing the first AF data or the second AF data.

16. The method of claim 13, further comprising:
  setting priorities based on measurement values of photo diodes corresponding to a plurality of directions.

* * * * *